United States Patent
Ishimine et al.

(10) Patent No.: US 8,279,595 B2
(45) Date of Patent: Oct. 2, 2012

(54) STORAGE UNIT AND INFORMATION PROCESSING APPARATUS AND METHOD OF COOLING

(75) Inventors: Junichi Ishimine, Kawasaki (JP); Atsushi Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/405,292

(22) Filed: Mar. 17, 2009

(65) Prior Publication Data

US 2009/0303678 A1    Dec. 10, 2009

(30) Foreign Application Priority Data

Jun. 5, 2008  (JP) .................................. 2008-148637

(51) Int. Cl.
- *H05K 5/00* (2006.01)
- *H05K 7/20* (2006.01)
- *A47B 77/08* (2006.01)

(52) U.S. Cl. ......... 361/679.48; 361/679.46; 361/679.47; 361/679.49; 361/679.5; 361/679.51; 454/184; 312/236

(58) Field of Classification Search .................. 361/690, 361/692–695, 679.46–679.51; 165/80.2
See application file for complete search history.

(56) References Cited

U.S. PATENT DOCUMENTS

| | | | |
|---|---|---|---|
| 6,625,033 B1 * | 9/2003 | Steinman | 361/753 |
| 6,702,665 B1 * | 3/2004 | Tai | 454/256 |
| 7,593,225 B2 * | 9/2009 | Sasagawa et al. | 361/695 |
| 2004/0130868 A1 | 7/2004 | Schwartz et al. | |
| 2004/0184233 A1 | 9/2004 | Yamada | |
| 2006/0044756 A1 | 3/2006 | Wong | |
| 2008/0239656 A1 * | 10/2008 | Sasagawa et al. | 361/685 |
| 2008/0257639 A1 | 10/2008 | Yamaguchi et al. | |

FOREIGN PATENT DOCUMENTS

| | | |
|---|---|---|
| EP | 887725 A1 | 12/1998 |
| EP | 1746483 A1 | 1/2007 |
| JP | 4-44297 A | 3/1992 |
| JP | 2001-60787 A | 3/2001 |
| JP | 2008-269111 A | 11/2008 |
| JP | 2008-269112 A | 11/2008 |
| JP | 2008-270372 A | 11/2008 |
| JP | 2008-270373 A | 11/2008 |

(Continued)

OTHER PUBLICATIONS

Press Release of 19-inch (low-noise type standard/24U) rack (http://primeserver,fujitsu.com/primergy/products/news/20071009).

(Continued)

*Primary Examiner* — Jayprakash N Gandhi
*Assistant Examiner* — Jerry Wu
(74) *Attorney, Agent, or Firm* — Westerman, Hattori, Daniels & Adrian, LLP

(57) ABSTRACT

A storage unit includes: a storage section containing an information processing apparatus; an intake section allowing intake of a cooling medium into the information processing apparatus for cooling the information processing apparatus; a discharge section receiving the cooling medium discharged from the information processing apparatus; a cooling medium flow generating section configured to control intake and discharge of the cooling medium; a partition section isolating the intake section and the discharge section from each other; an aperture formed in the partition section; a detector section configured to detect an inflow of the cooling medium, discharged from the discharge section, through the aperture; and a controller section configured to control the cooling medium flow generating section in accordance with a result of the detection of the detector section.

10 Claims, 16 Drawing Sheets

FOREIGN PATENT DOCUMENTS

JP    2008-270374 A    11/2008

OTHER PUBLICATIONS

Introduction of 19-inch (low-noise type standard/24U) rack, Oct. 2007.

Catalog of 19-inch (low-noise type standard/24U) rack (the relevant content is cumulative to 9. and 10.), Oct. 2007.

European Search Report dated Oct. 27, 2009, issued in corresponding European Patent Application No. 09155436.

* cited by examiner

US 8,279,595 B2

STORAGE UNIT AND INFORMATION PROCESSING APPARATUS AND METHOD OF COOLING

CROSS-REFERENCE TO RELATED APPLICATION

This application is based upon and claims the benefit of priority of the prior Japanese Patent Application No. 2008-148637, filed on Jun. 5, 2008, the entire contents of which are incorporated herein by reference.

FIELD

The embodiments discussed herein are related to a storage unit for enclosing an information processing apparatus.

BACKGROUND

Some information processing apparatuses include a rack placed in a storage section, namely a box-shaped enclosure. A server computer or computers of a rack mount type is mounted on the rack, for example. An airflow generator is enclosed in the enclosure of the server computer to generate airflow across the interior space of the enclosure of the server computer.

The airflow generator operates in the box-shaped enclosure. It is required to supply a sufficient amount of air to the airflow generator. In general, a ventilation fan is utilized to supply air. An information processing apparatus includes an arbitrary number of a server computer or computers enclosed in the box-shaped enclosure. It is thus desired to introduce an appropriate amount of air into the box-shaped enclosure in accordance with the number of the mounted server computer.

SUMMARY

According to an aspect of the invention, a storage unit includes: a storage section containing an information processing apparatus; an intake section allowing intake of a cooling medium into the information processing apparatus for cooling the information processing apparatus; a discharge section receiving the cooling medium discharged from the information processing apparatus; a cooling medium flow generating section configured to control intake and discharge of the cooling medium; a partition section isolating the intake section and the discharge section from each other; an aperture formed in the partition section; a detector section configured to detect an inflow of the cooling medium, discharged from the discharge section, through the aperture; and a controller section configured to control the cooling medium flow generating section in accordance with a result of the detection of the detector section.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENTS

Embodiments of the invention will be explained below with reference to the accompanying drawings.

Figure 1:
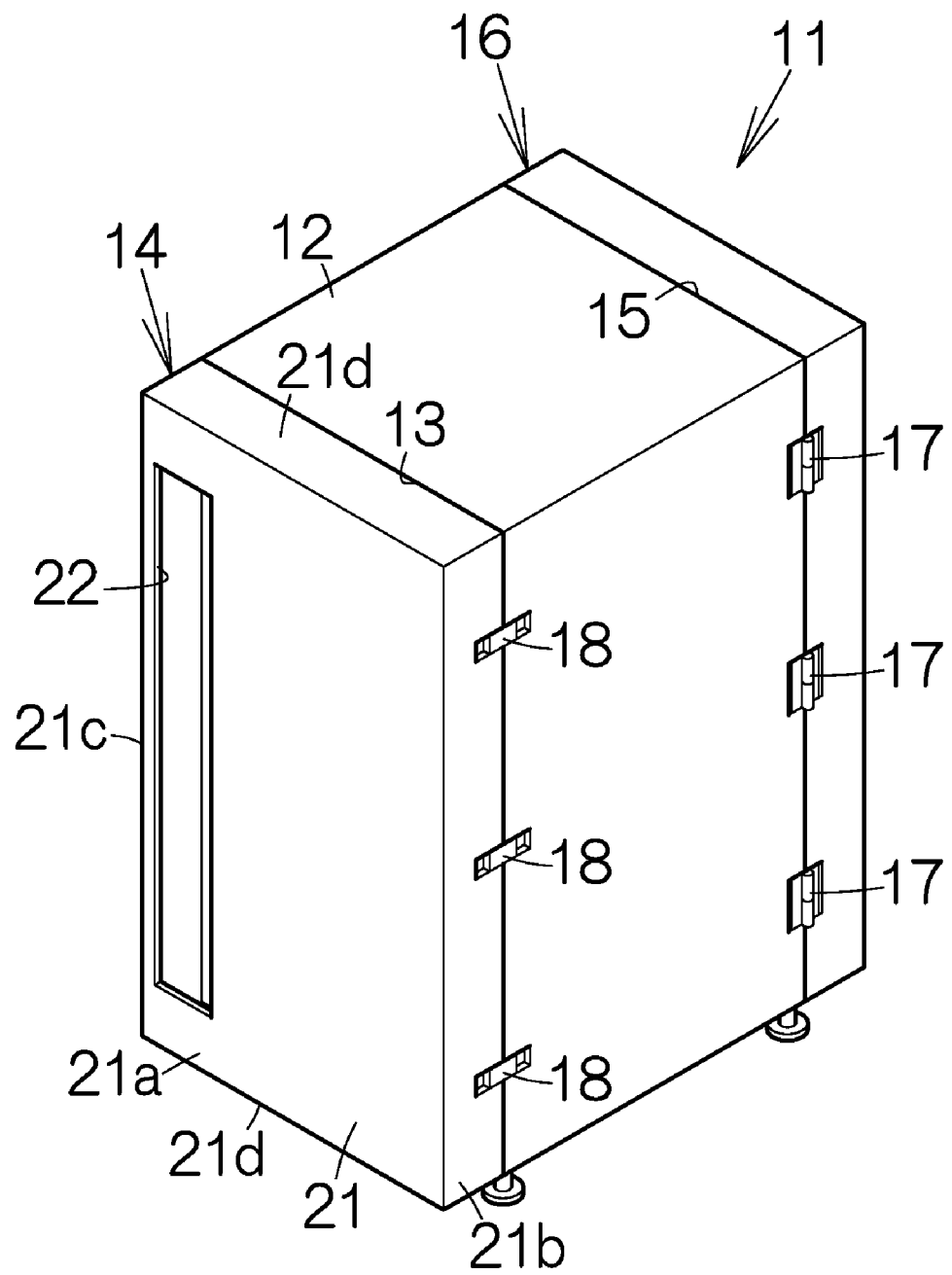
FIG. 1 is a front perspective view of schematically illustrating a storage box, for an information processing apparatus, as a storage unit according to a first embodiment of the present invention.

FIG. 1 schematically illustrates a storage box 11, for an information processing apparatus, as a storage unit according to a first embodiment of the present invention. The storage box 11 includes a box-shaped enclosure 12. A first door 14 is configured to close a first plane, namely a front surface 13 of the box-shaped enclosure 12. A second door 16 is likewise configured to close a second plane, namely a back surface 15 of the box-shaped enclosure 12. The first door 14 and the second door 16 are coupled to the box-shaped enclosure 12 for relative swinging movement, namely for opening and closing operations. Hinges 17 may be utilized to couple the first and second doors 14, 16, for example. The first door 14 and the second door 16 are respectively allowed to swing around the hinge pins of the hinges 17. The hinges 17 accept the attachment and detachment of the first door 14 and the second door 16 to and from the box-shaped enclosure 12. Latches 18 in combination with the hinges 17 serve to make the first door 14 and the second door 16 tightly contact with the box-shaped enclosure 12. The latches 18 prevent the first door 14 and the second door 16 from opening. Deadening walls are employed to form the box-shaped enclosure 12, the first door 14 and the second door 16.

The first door 14 includes a first auxiliary box-shaped enclosure 21. The first auxiliary box-shaped enclosure 21 includes a first outer wall member 21a extending in parallel with the front surface 13 of the box-shaped enclosure 12. Second and third outer wall members 21b, 21c are connected to the side edges of the first outer wall member 21a, respectively. The second and third outer wall members 21b, 21c are opposed to each other. Fourth outer wall members 21d, 21d are connected to the upper and lower edges of the first outer wall member 21a, respectively. The fourth outer wall members 21d, 21d are opposed to each other. As described later, the first outer wall member 21a, the second outer wall member 21b, the third outer wall member 21c and the fourth outer wall members 21d, 21d are combined together to define an auxiliary space in the form of a parallelepiped. A first ventilation opening 22 is formed in the first outer wall member 21a. The first ventilation opening 22 is a window opening elongated in the direction of gravity. The first ventilation opening 22 extends along the edge defined between the first outer wall member 21a and the third outer wall member 21c.

Figure 2:
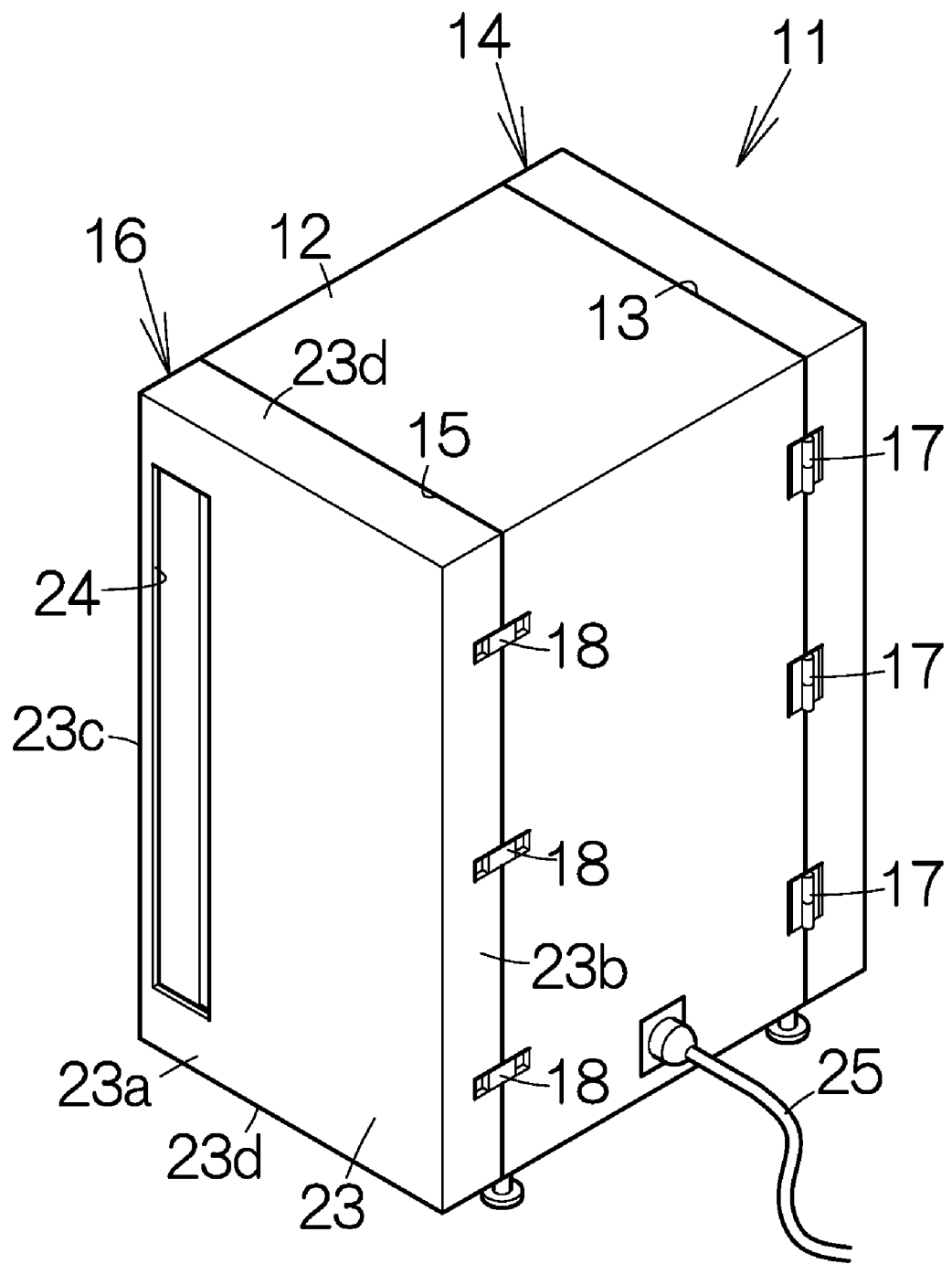
FIG. 2 is a rear perspective view schematically illustrating the storage box.

As depicted in FIG. 2, the second door 16 includes a second auxiliary box-shaped enclosure 23. The second auxiliary box-shaped enclosure 23 includes a first outer wall member 23a extending in parallel with the back surface 15 of the box-shaped enclosure 12. Second and third outer wall members 23b, 23c are connected to the side edges of the first outer wall member 23a, respectively. The second and third outer wall members 23b, 23c are opposed to each other. Fourth outer wall members 23d, 23d are connected to the upper and lower edges of the first outer wall member 23a, respectively. The fourth outer wall members 23d, 23d are opposed to each other. As described later, the first outer wall member 23a, the second outer wall member 23b, the third outer wall member 23c and the fourth outer wall members 23d, 23d are combined together to define an auxiliary space in the form of a parallelepiped. A second ventilation opening 24 is formed in the first outer wall member 23a. The second ventilation opening 24 is a window opening elongated in the direction of gravity. The second ventilation opening 24 extends along the edge defined between the first outer wall member 23a and the third outer wall member 23c.

A power supply cord 25 is connected to the side surface of the box-shaped enclosure 12. The power supply cord 25 is connected to an outlet, for example. Electric power is supplied to the box-shaped enclosure 12 through the power supply cord 25.

Figure 3:
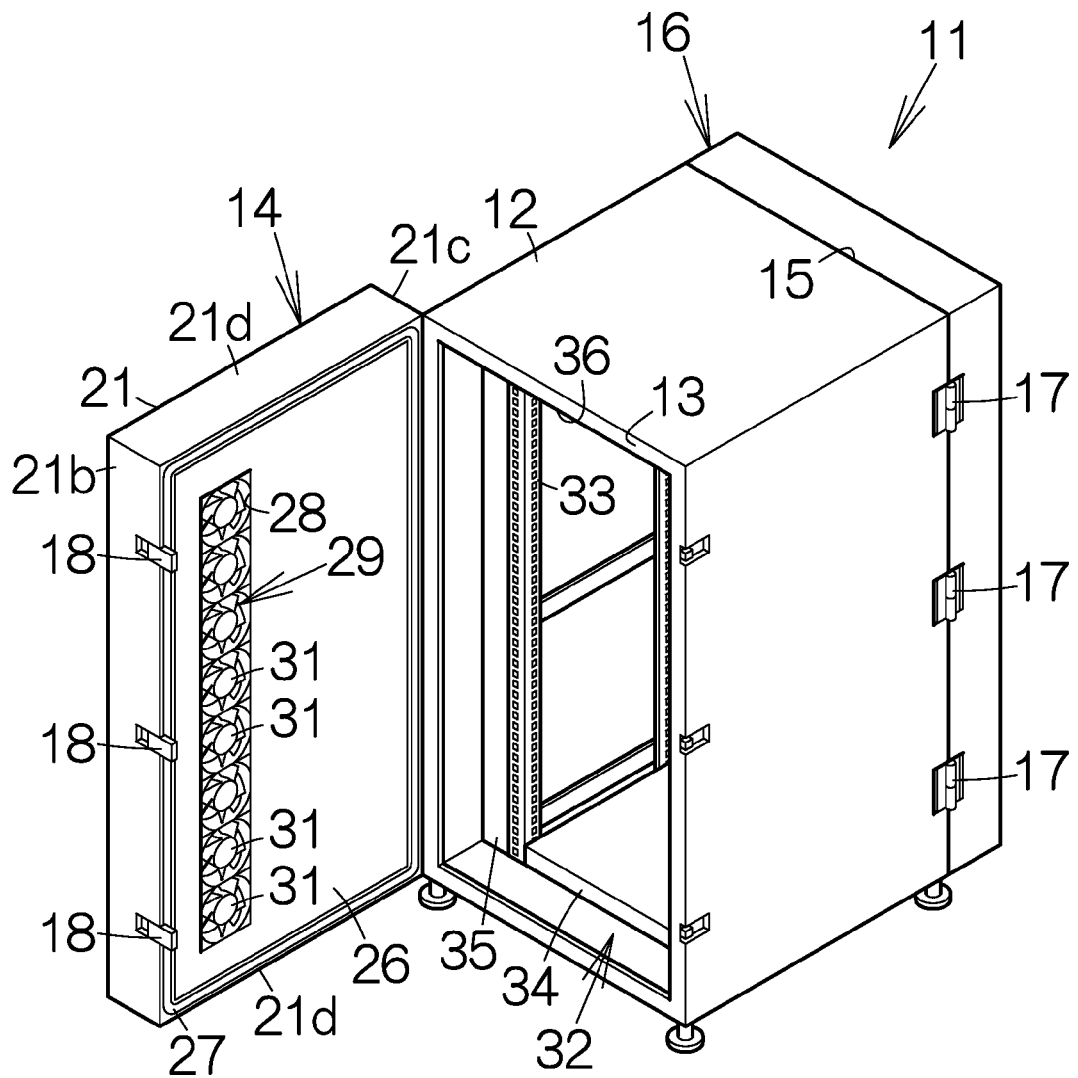
FIG. 3 is a front perspective view schematically illustrating the storage box with a first door opened.

As depicted in FIG. 3, the first door 14 includes a first deadening wall member 26. The first deadening wall member 26 closes the front surface 13 of the box-shaped enclosure 12. The outer periphery of the first deadening wall member 26 is connected to the second outer wall member 21b, the third outer wall member 21c and the fourth outer wall members 21d. When the first door 14 is closed, the first deadening wall member 26 extends along the front surface 13 of the box-shaped enclosure 12. A packing member 27 is attached to the first deadening wall member 26 without a gap along the outer periphery of the first deadening wall member 26. The packing member 27 may be made of rubber, for example. The packing member 27 will be described later in detail.

A first through opening 28 is formed in the first deadening wall member 26. The first through opening 28 is a window opening elongated in the direction of gravity. The first through opening 28 extends along the edge defined between the first deadening wall member 26 and the second outer wall member 21b. A first ventilating unit 29 is mounted in the first through opening 28. The first ventilating unit 29 includes eight first ventilators 31, for example. The individual first ventilator 31 may be an axial flow fan unit, for example. The axial flow fan unit allows blades to rotate around a rotation axis extending in the horizontal direction. The axial flow fan unit generates horizontal airflow. The individual first ventilator 31 is fixed to the first deadening wall member 26. The individual first ventilator 31 is separately removable from the first deadening wall member 26. The first ventilating unit 29 has a performance to generate a predetermined amount of airflow. The first ventilators 31 may be arranged in the direction of gravity, for example.

A storage space 32 in the form of a parallelepiped is defined within the box-shaped enclosure 12 between the front surface 13 and the back surface 15, for example. The box-shaped enclosure 12 opens at the front surface 13 and the back surface 15, for example. A rack 33 is placed within the storage space 32. The rack 33 is constructed as a so-called 19-inch rack. The rack 33 is designed to define a rack space for enclosing an information processing apparatus. The information processing apparatus will be described later.

A controller box 34 is placed on the bottom plate of the box-shaped enclosure 12. A controller board is incorporated in the controller box 34 for controlling the operation of the first ventilators 31, for example. The controller board will be described later in detail.

Figure 4:
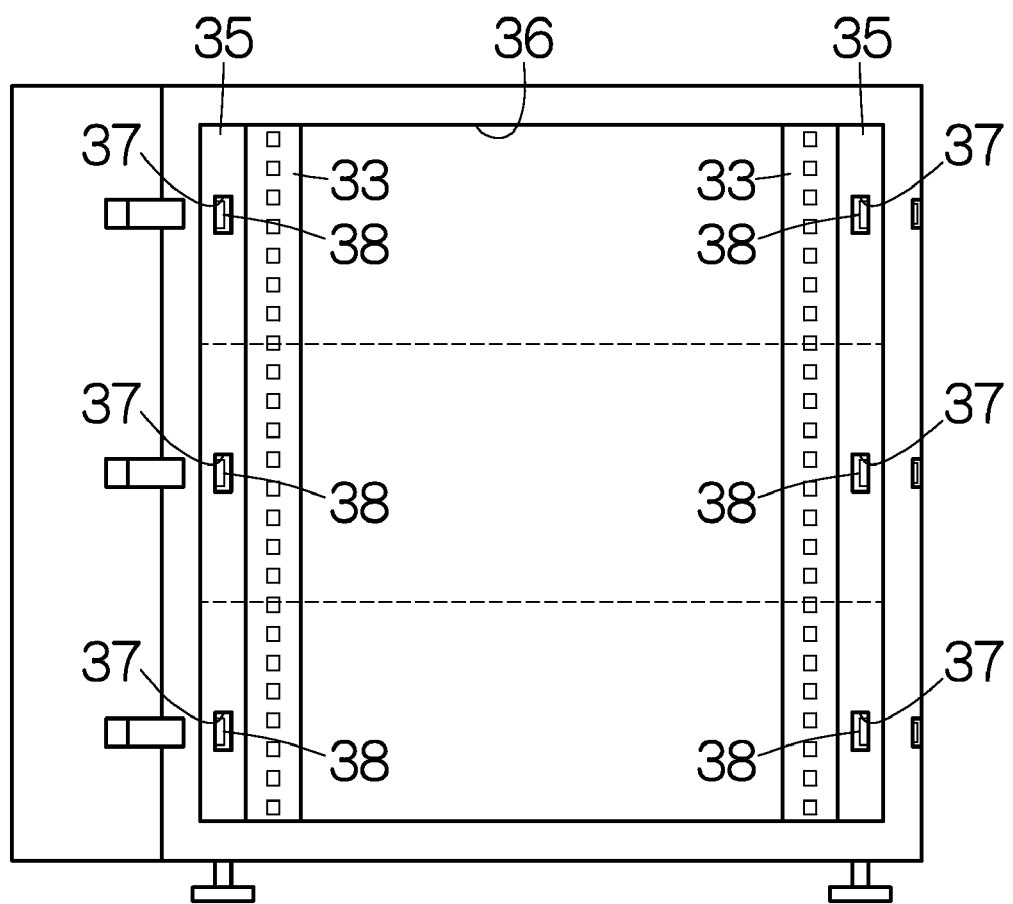
FIG. 4 is a front view schematically illustrating the storage box with the first door opened.

As depicted in FIG. 4, partition boards 35 are placed within the box-shaped enclosure 12. The partition boards 35 serve to close a gap between the rack 33 and the box-shaped enclosure 12. The partition boards 35 define the intake surface of a ventilation duct. The partition boards 35 and the box-shaped enclosure 12 in combination serve to form a ventilation duct. The discharge surface of the ventilation duct corresponds to the back surface 15 of the box-shaped enclosure 12. The partition boards 35 define the entrance of the rack space, namely an air inlet 36, in the intake surface of the ventilation duct.

Apertures 37 are formed in the individual partition board 35. The apertures 37 may appropriately be arranged in accordance with the temperature distribution within the ventilation duct. Here, the apertures 37 are placed at three spots on each of the right and left sides of the rack 33. The storage space 32 of the box-shaped enclosure 12 is equally divided into three space segments in the vertical direction, namely in the direction of gravity, for example. Specifically, the heights of the space segments are set equal. The apertures 37 are placed in the corresponding space segments, respectively, at the middle position equally distanced from the upper and lower surfaces of the individual space segment. The apertures 37 allow the intake and discharge of airflow for the ventilation duct. A first thermal sensor 38 is placed in the individual aperture 37. The first thermal sensor 38 is configured to detect the temperature of airflow passing through the corresponding aperture 37.

Figure 5:
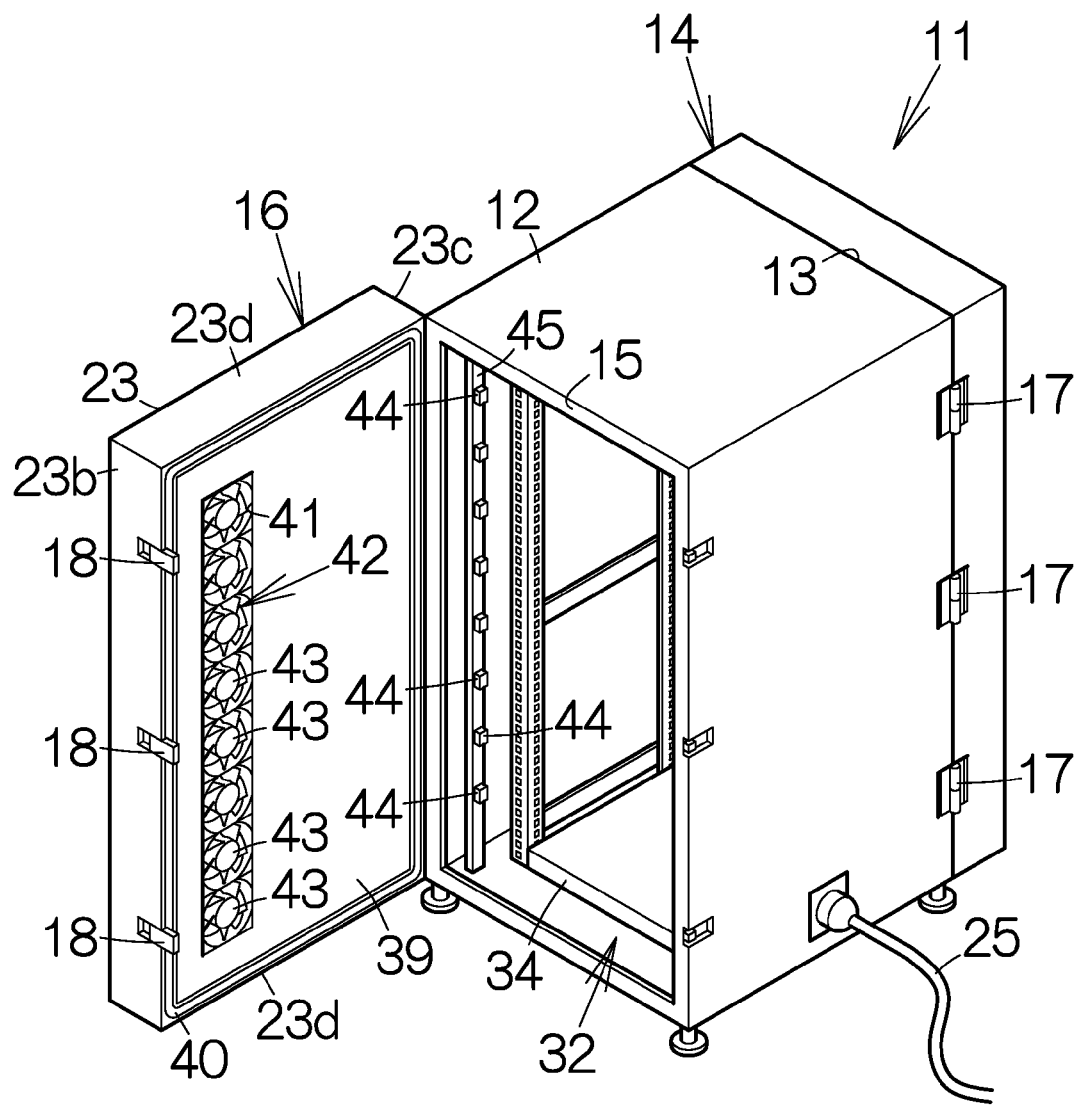
FIG. 5 is a rear perspective view schematically illustrating the storage box with a second door opened.

As depicted in FIG. 5, the second door 16 includes a second deadening wall member 39. The second deadening wall member 39 closes the back surface 15 of the box-shaped enclosure 12. The outer periphery of the second deadening wall member 39 is connected to the second outer wall member 23b, the third outer wall member 23c and the fourth outer wall members 23d. When the second door 16 is closed, the second deadening wall member 39 extends along the back surface 15 of the box-shaped enclosure 12. A packing member 40 is attached to the second deadening wall member 39 without a gap along the outer periphery of the second deadening wall member 39. The packing member 40 may be made of rubber, for example.

A second through opening 41 is formed in the second deadening wall member 39. The second through opening 41 is a window opening elongated in the direction of gravity. The second through opening 41 extends along the edge defined between the second deadening wall member 39 and the second outer wall member 23b. A second ventilating unit 42 is mounted in the second through opening 41. The second ventilating unit 42 includes eight second ventilators 43, for example. The individual second ventilator 43 may be an axial flow fan unit, for example. The axial flow fan unit allows blades to rotate around a rotation axis extending in the horizontal direction. The axial flow fan unit generates horizontal airflow. The individual second ventilator 43 is fixed to the second deadening wall member 39. The individual second ventilator 43 is separately removable from the second deadening wall member 39. The second ventilators 43 may be arranged in the direction of gravity, for example. The second ventilating unit 42 includes a set of ventilators identical to a set of ventilators incorporated in the first ventilating unit 29. The second ventilating unit 42 thus has a performance equivalent to that of the first ventilating unit 29.

Second thermal sensors 44 are placed in the ventilation duct. The second thermal sensors 44 are attached to a support post 45, extending in the direction of gravity, at predetermined intervals, for example. The support post 45 is placed between the second deadening wall member 39 and the interior space of the rack 33. Specifically, the support post 45 is placed outside the interior space of the rack 33 at a position distanced from the second deadening wall member 39. The second thermal sensors 44 are arranged along the edge defined between the second deadening wall member 39 and the third outer wall member 23c. The second thermal sensors 44 are designed to detect the ambient temperature.

Figure 6:
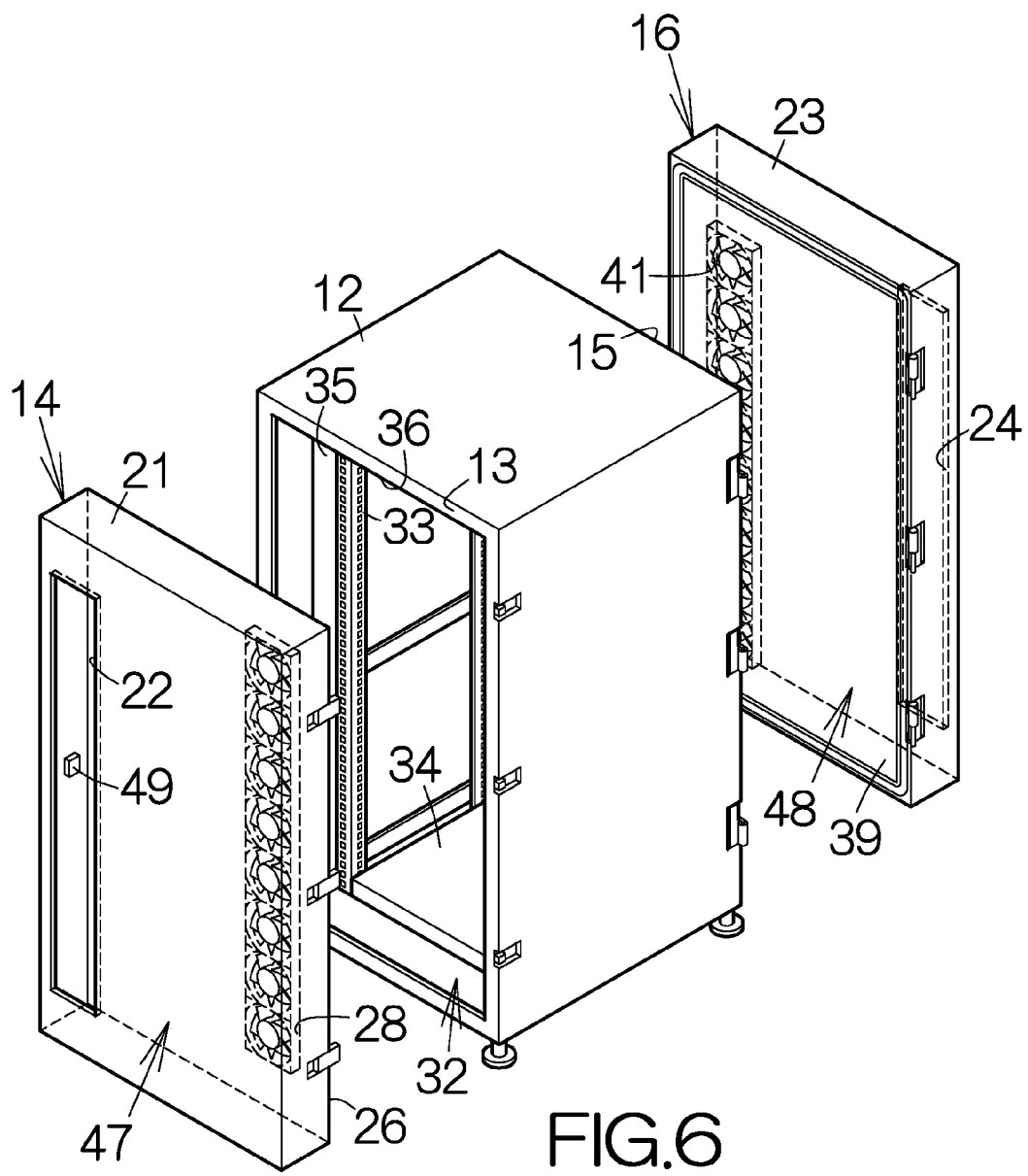
FIG. 6 is an exploded view schematically illustrating a storage space, a first auxiliary space and a second auxiliary space.

As depicted in FIG. 6, the first auxiliary box-shaped enclosure 21 of the first door 14 defines a first auxiliary space 47 in the form of a parallelepiped. The first deadening wall member 26 serves to isolate the first auxiliary space 47 from the storage space 32. The first auxiliary space 47 has a cross-section elongated in the direction of gravity. The first auxiliary space 47 is spatially connected to the storage space 32 through the first through opening 28. The first auxiliary space 47 is spatially connected to the outer space through the first ventilation opening 22. The first ventilation opening 22 is formed on the first auxiliary box-shaped enclosure 21 at a position opposed to the first deadening wall member 26 off the first through opening 28. Specifically, the position of the first ventilation opening 22 is shifted from the position of the first through opening 28.

Likewise, the second auxiliary box-shaped enclosure 23 of the second door 16 defines a second auxiliary space 48 in the form of a parallelepiped. The second deadening wall member 39 serves to isolate the second auxiliary space 48 from the storage space 32. The second auxiliary space 48 has a cross-section elongated in the direction of gravity. The second auxiliary space 48 is spatially connected to the storage space 32 through the second through opening 41. The second auxiliary space 48 is spatially connected to the outer space through the second ventilation opening 24. The second ventilation opening 24 is formed in the second auxiliary box-shaped enclosure 23 at a position opposed to the second deadening wall member 39 off the second through opening 41. Specifically, the position of the second ventilation opening 24 is shifted from the position of the second through opening 41.

A third thermal sensor 49 is set in the first auxiliary space 47. The third thermal sensor 49 is attached to the third outer wall member 21c of the first auxiliary box-shaped enclosure 21. The third thermal sensor 49 is designed to detect the ambient temperature.

Figure 7:
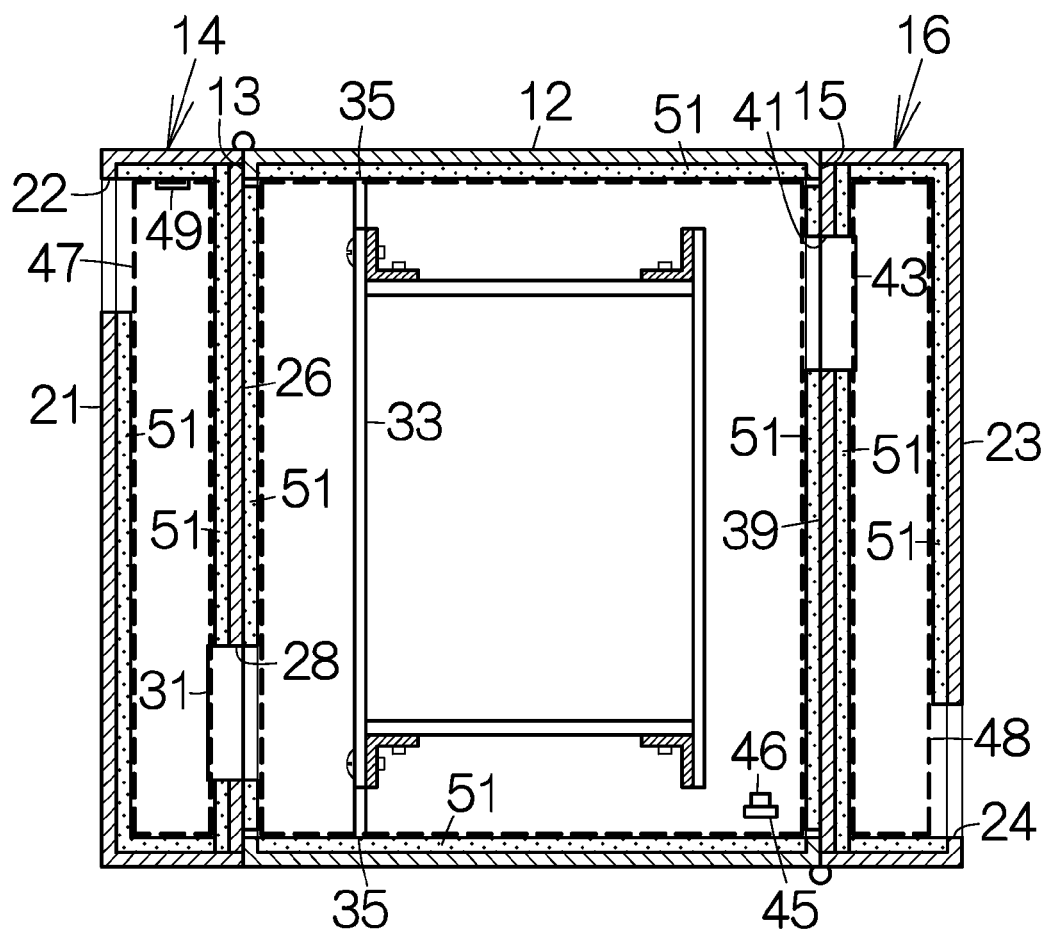
FIG. 7 is a sectional view schematically illustrating the inner structure of the storage box according to the first embodiment of the present invention.

As depicted in FIG. 7, the box-shaped enclosure 12, the first auxiliary box-shaped enclosure 21, the first deadening wall member 26, the second auxiliary box-shaped enclosure 23 and the second deadening wall member 39 are made of a deadening panel or panels or sound insulating material. The sound insulating material allows insulation of sound. A steel plate of a considerable thickness may be employed as the sound insulating material, for example. An increased thickness of the steel plate results in an enhanced rigidity of the steel plate. The enhanced rigidity enables a higher performance of insulation. An acoustic material 51 of a predetermined thickness is attached to the inner surface of the box-shaped enclosure 12, the inner surface of the first auxiliary box-shaped enclosure 21, the front and back surfaces of the first deadening wall member 26, the inner surface of the second auxiliary box-shaped enclosure 23, and the front and back surfaces of the second deadening wall member 39. The acoustic material 51 is capable of absorbing sound. A urethane resin, a glass wool, a rock wool, a nonwoven fabric, or the like, may be employed as the acoustic material 51.

The first auxiliary space 47 extends from the first through opening 28 to the first ventilation opening 22. The first auxiliary space 47 bends between the first through opening 28 and the first ventilation opening 22. The first ventilation opening 22 is formed on the first auxiliary box-shaped enclosure 21 at a position farthest from the first through opening 28. A distance between the first ventilation opening 22 and the first through opening 28 may be set at 0.25 [m] or larger. Likewise, the second auxiliary space 48 extends from the second through opening 41 to the second ventilation opening 24. The second auxiliary space 48 bends between the second through opening 41 and the second ventilation opening 24. The second ventilation opening 24 is formed on the second auxiliary box-shaped enclosure 23 at a position farthest from the second through opening 41. A distance between the second ventilation opening 24 and the second through opening 41 may be set at 0.25 [m] or larger. A flow passage for airflow is established in the storage box 11 based on the first ventilation opening 22, the first auxiliary space 47, the first through opening 28, the storage space 32, the second through opening 41 and the second ventilation opening 24.

Figure 8:
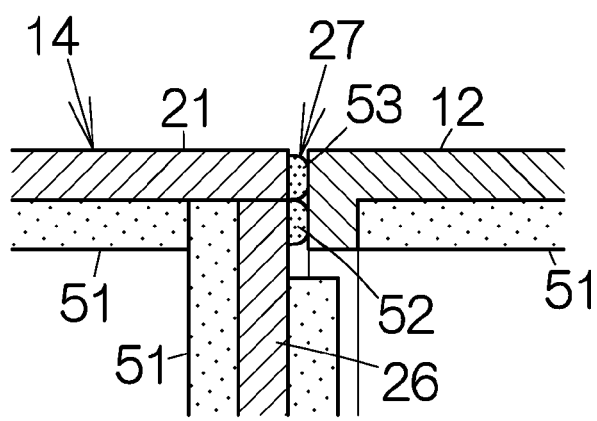
FIG. 8 is an enlarged partial sectional view schematically illustrating a packing member according to an example.

As depicted in FIG. 8, the packing member 27 includes a first elastic packing 52 and a second elastic packing 53, both attached to the first door 14 to surround the storage space 32. The second elastic packing 53 is attached to the first door 14 outside the first elastic packing 52. Alternatively, both of the first elastic packing 52 and the second elastic packing 53 may be attached to the box-shaped enclosure 12. Likewise, one of the first elastic packing 52 and the second elastic packing 53 may be attached to the first door 14 while the other of the first elastic packing 52 and the second elastic packing 53 is attached to the box-shaped enclosure 12. It should be noted that the packing member 40 has the structure identical to that of the packing member 27.

When the first door 14 or the second door 16 is closed, the first elastic packing 52 and the second elastic packing 53 are interposed between the box-shaped enclosure 12 and the first door 14 or the second door 16. The first elastic packing 52 and the second elastic packing 53 are tightly held to elastically deform between the box-shaped enclosure 12 and the first door 14 or the second door 16. The first elastic packing 52 and the second elastic packing 53 in this manner serve to eliminate a gap or gaps between the box-shaped enclosure 12 and the first door 14 or the second door 16 around the storage space 32 over the entire length.

Figure 9:
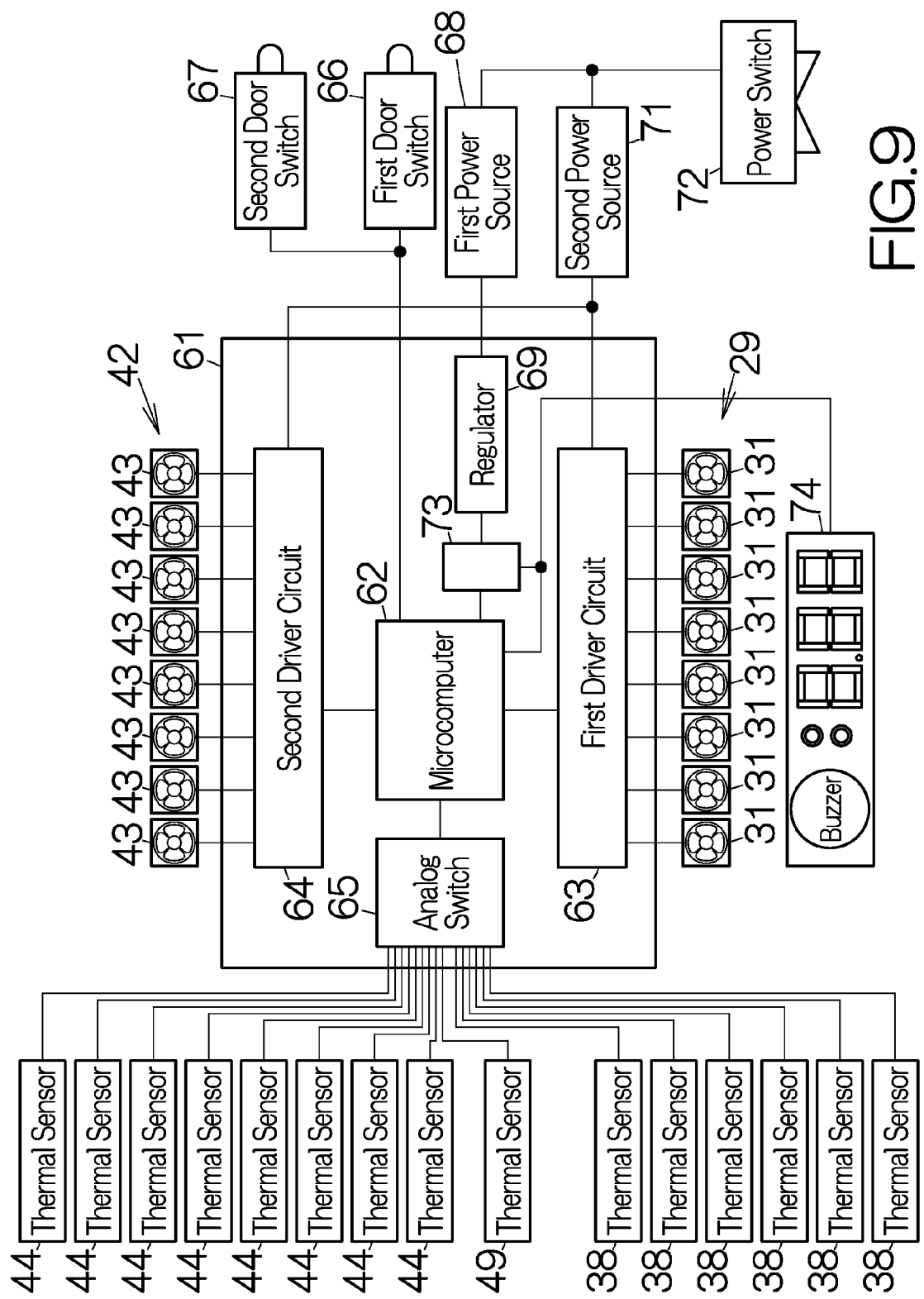
FIG. 9 is a block diagram showing a control system.

FIG. 9 illustrates a control system according to an example of the present invention. The controller board 61 is incorporated in the controller box 34 as described above. A controller circuit, namely a microcomputer 62, is mounted on the controller board 61. The microcomputer 62 is configured to execute processing based on a program stored in an embedded memory. The microcomputer 62 reads out required data out of the embedded memory when the microcomputer 62 executes processing.

A first driver circuit 63 is mounted on the controller board 61. The first driver circuit 63 is connected to the individual first ventilators 31. The first driver circuit 63 is configured to control the on/off of the individual first ventilators 31 and the revolution speed of the individual first ventilators 31 in accordance with the instructions from the microcomputer 62. Voltage is applied to the individual first ventilators 31 from the first driver circuit 63 to control the on/off and the revolution speed. The first ventilators 31 are allowed to perform to establish an equalized flow rate of the airflow based on the control, for example. The microcomputer 62 is capable of monitoring the status of the individual first ventilators 31 based on the operation of the first driver circuit 63.

A second driver circuit 64 is likewise mounted on the controller board 61. The second driver circuit 64 is connected to the individual second ventilators 43. The second driver circuit 64 is configured to control the on/off of the individual second ventilators 43 and the revolution speed of the individual second ventilators 43 in accordance with the instructions from the microcomputer 62. Voltage is applied to the individual second ventilators 43 from the second driver circuit 64 to control the on/off and the revolution speed. The second ventilators 43 are allowed to perform to establish an equalized flow rate of the airflow based on the control, for example. The microcomputer 62 is capable of monitoring the status of the individual second ventilators 43 based on the operation of the second driver circuit 64.

The aforementioned first, second and third thermal sensors 38, 44, 49 are connected to the microcomputer 62. The individual thermal sensors 38, 44, 49 are configured to output a sensor signal to the microcomputer 62. The sensor signal serves to represent the temperature information specifying a temperature detected at the individual thermal sensor 38, 44, 49. The microcomputer 62 in this manner obtains the temperature information for the individual thermal sensors 38, 44, 49. An analog switch 65 is interposed between the microcomputer 62 and the first to third thermal sensors 38, 44, 49 for the collection of the temperature information. The analog switch 65 is utilized to connect the microcomputer 62 to the thermal sensors 38, 44, 49 in order. The sensor signals of the thermal sensors 38, 44, 49 are in this manner distinguished from one another.

A first door switch 66 and a second door switch 67 are connected to the microcomputer 62. The first door switch 66 is placed between the box-shaped enclosure 12 and the first door 14, for example. The first door switch 66 is configured to detect the opening of the first door 14. The first door switch 66 outputs a first detection signal to the microcomputer 62. The first detection signal represents detection information specifying the opening of the first door 14. The first door switch 66 may be a contact switch which allows electric connection when the first door 14 is closed. Likewise, the second door switch 67 is placed between the box-shaped enclosure 12 and the second door 16, for example. The second door switch 67 is designed to detect the opening of the second door 16. The second door switch 67 outputs a second detection signal to the microcomputer 62. The second detection signal represents detection information specifying the opening of the second door 16. The second door switch 67 may be a contact switch which allows electrical connection when the second door 16 is closed.

A first power source 68 is connected to the microcomputer 62. The alternating voltage is supplied to the first power source 68. The first power source 68 is configured to convert the alternating voltage to the direct voltage. A regulator 69 is interposed between the microcomputer 62 and the first power source 68. The regulator 69 may be mounted on the controller board 61, for example. The regulator 69 is configured to convert the direct voltage from the first power source 68 to the voltage of a predetermined voltage level. The voltage of a desired voltage level is in this manner applied to the microcomputer 62. Likewise, a second power source 71 is connected to the first driver circuit 63 and the second driver circuit 64. The alternating voltage is supplied to the second power source 71. The second power source 71 is configured to convert the alternating voltage to the direct voltage. Voltage of a desired voltage level is in this manner applied to the first driver circuit 63 and the second driver circuit 64.

A power switch 72 is connected to the first and second power sources 68, 71. Electric power is supplied to the power switch 72 through the aforementioned power supply cord 25. When the power switch 72 is opened, the first and second power sources 68, 71 stop receiving the electric power. When the power switch 72 is closed, the electric power is supplied to the first and second power sources 68, 71.

An error monitoring circuit 73 is interposed between the microcomputer 62 and the regulator 69. The error monitoring circuit 73 is designed to detect the voltage supplied from the regulator 69 to the microcomputer 62. The error monitoring circuit 73 monitors the output signal from the microcomputer 62 for a predetermined period after the start of the supply of the voltage. If the error monitoring circuit 73 receives no output signal from the microcomputer 62 in the predetermined period, the error monitoring circuit 73 detects a malfunction of the microcomputer 62. The microcomputer 62 is set to execute a predetermined initial operation. The initial operation forces the microcomputer 62 to output the aforementioned output signal to the error monitoring circuit 73 immediately after the microcomputer 62 starts receiving voltage.

A display device 74 is connected to the microcomputer 62 and the error monitoring circuit 73. The display device 74 may be placed on the outer surface of the box-shaped enclosure 12 or the first door 14, for example. The microcomputer 62 outputs a predetermined display signal based on the status of the aforementioned sensor signals, the status of the first and second driver circuits 63, 64, and the first and second detection signals. A predetermined display is displayed on the display device 74 based on such a display signal. Likewise, the error monitoring circuit 73 outputs a predetermined display signal to the display device 74 in response to the detection of a malfunction of the microcomputer 62. Here, alphanumeric characters may be displayed on the display device 74. A specific meaning may be assigned to an alphanumeric string beforehand. The display device 74 serves to reliably notify the user of the status of the first and second ventilating units 29, 42, for example. The user is allowed to reliably become aware of the status of the first and second ventilating units 29, 42.

Figure 10:
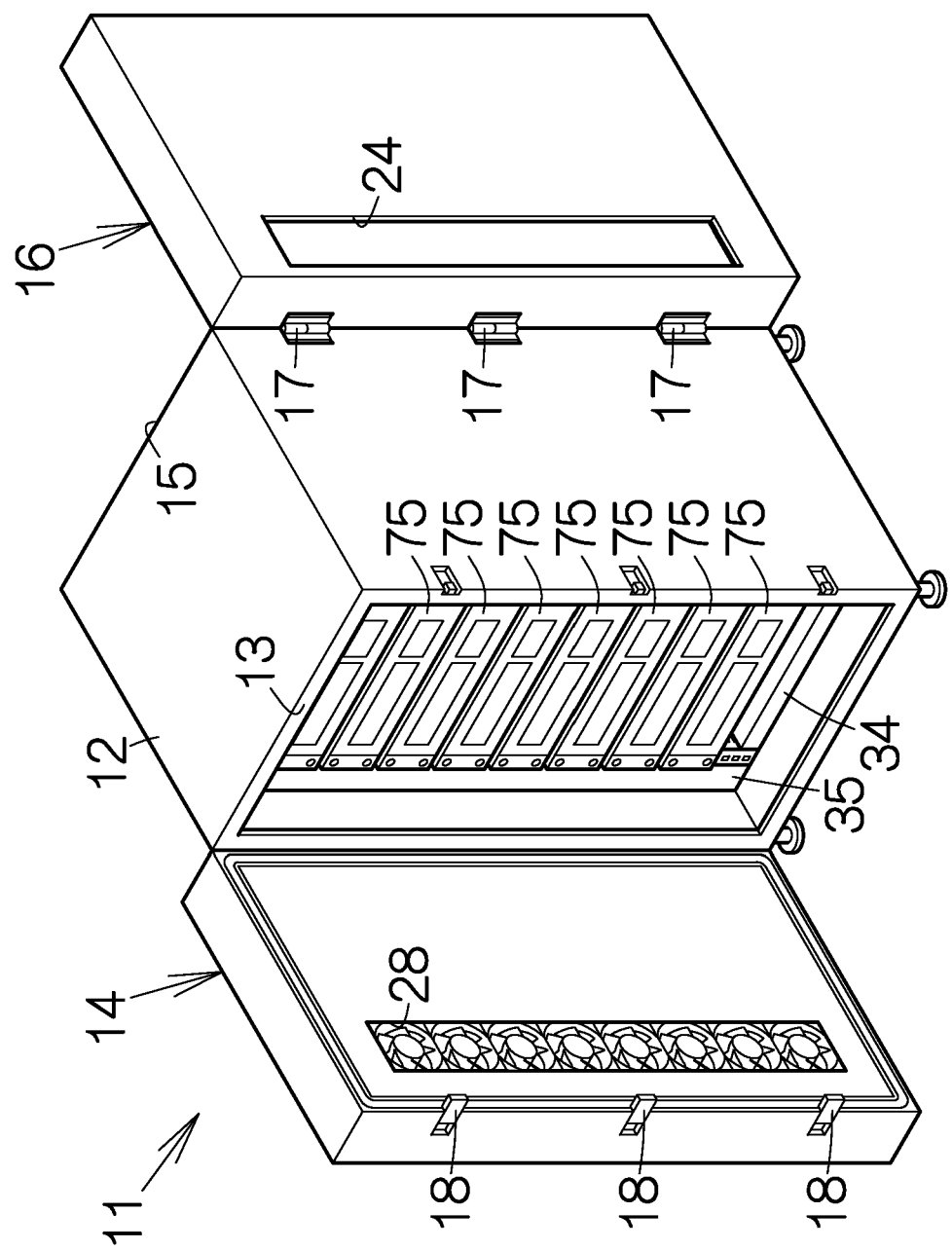
FIG. 10 is a front perspective view schematically illustrating the storage box with an information processing apparatus mounted therein.

Now, as depicted in FIG. 10, assume that server computers 75 of a rack mount type as information processing apparatuses are mounted on the rack 33 within the storage box 11, for example. The storage box 11 provides an information processing apparatus in response to the incorporation of the server computers 75 into the storage box 11. The front panels of the server computers 75 close the air inlet 36. The front panel of the individual server computer 75 serves to provide the inlet of the individual server computer 75 within the intake surface of the ventilation duct. The power cord of the individual server computer 75 is connected to the aforementioned power supply cord 25, for example. Electric power is supplied to the server computers 75 through the power supply cord 25. The first door 14 and the second door 16 are opened during the setting and connection of the server computers 75. When the setting and connection have been completed, the first door 14 and second door 16 are closed. The latches 18 serve to urge the first door 14 and the second door 16 against the box-shaped enclosure 12. The first elastic packing 52 and the second elastic packing 53 serve to eliminate a gap or gaps between the box-shaped enclosure 12 and the first door 14 and between the box-shaped enclosure 12 and the second door 16 around the storage space 32 over the entire length.

Figure 11:
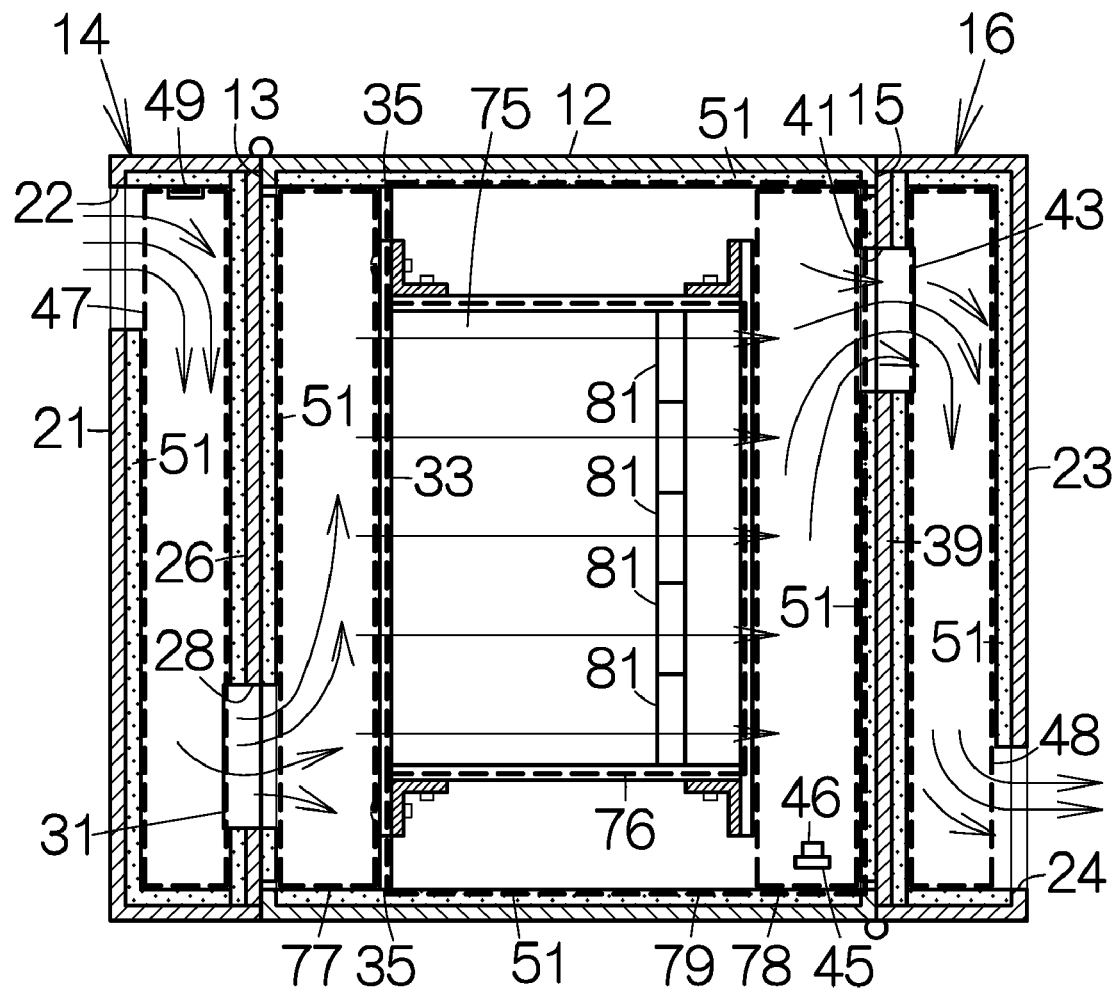
FIG. 11 is a sectional view schematically illustrating airflow generated in the storage box during operation.

As depicted in FIG. 11, the individual server computers 75 are placed within the interior space 76 of the rack 33. In this case, a predetermined space is maintained between the front panels of the server computers 75 and the first deadening wall member 26. A front space 77 is thus formed between the interior space 76 and the first deadening wall member 26. Likewise, a predetermined space is maintained between the rear panels of the server computers 75 and the second deadening wall member 39. A rear space 78 is thus formed between the interior space 76 and the second deadening wall member 39. The front panels of the server computers 75 and the partition boards 35 in combination define the ventilation duct 79 within the box-shaped enclosure 12. The ventilation duct 79 contains the interior space 76 and the rear space 78. The first ventilators 31 are thus placed at positions upstream of the intake surface of the ventilation duct 79. The second ventilators 43 are placed at positions downstream of the discharge surface of the ventilation duct 79.

A cooling fan 81 operates within the individual server computer 75 in accordance with the inner temperature of the server computer 75 during the operation of the server computer 75. The cooling fan 81 serves as an airflow generator. As depicted in FIG. 11, the cooling fan 81 is configured to generate a horizontal airflow from the front space 77 to the rear space 78 within the enclosure of the server computer 75. The airflow is directed from the intake surface toward the discharge surface. In this case, the cooling fan 81 makes sound or noise during the operation. The box-shaped enclosure 12 and the first and second deadening wall members 26, 39 serve to insulate the sound. Simultaneously, the acoustic material 51 absorbs the sound within the box-shaped enclosure 12 and the first and second deadening wall members 26, 39. The sound leaks out only from the first through opening 28 and the second through opening 41. The sound is then directed from the first and second auxiliary spaces 47, 48 toward the first and second ventilation openings 22, 24. Since the acoustic material 51 surrounds the first and second auxiliary spaces 47, 48, the sound is sufficiently absorbed within the first and second auxiliary spaces 47, 48. In particular, the first and second auxiliary spaces 47, 48 are respectively configured to bend between the first and second through openings 28, 41 and the first and second ventilation openings 22, 24. The sound leaking from the first and second through openings 28, 41 collides against the first outer wall members 21a, 23a of the first and second auxiliary box-shaped enclosures 21, 23, namely the acoustic material 51. The transmission of the sound is effectively suppressed in this manner. The leakage of the sound is thus minimized. Noise is reliably reduced.

When the power switch 72 is turned on, electric power is supplied from the first power source 68 to the microcomputer 62. The microcomputer 62 receives a sensor signal output from the individual thermal sensor 38, 44, 49. The microcomputer 62 calculates the average of the temperature of the first thermal sensors 38 based on the sensor signals. The microcomputer 62 compares the average of the temperature of the first thermal sensors 38 with the temperature of the third thermal sensor 49. The microcomputer 62 operates to calculate a difference in temperature between the average of the temperature for the first thermal sensors 38 and the temperature for the third thermal sensor 49. If the difference in temperature is equal to a first temperature (one degree, for example) or larger, but less than a second temperature (four degrees, for example), the microcomputer 62 maintains the rotation speeds of the first and second ventilators 31, 43. If the difference in temperature is equal to the second temperature or larger, the microcomputer 62 operates to increase the rotation speed of the first and second ventilators 31, 43. Here, the rotation speed of the first and second ventilators 31, 43 can be changed stepwise at ten different levels, for example. The microcomputer 62 operates to increase the rotation speed of the first and second ventilators 31, 43 every two levels. The microcomputer 62 changes voltages output from the first and second driver circuits 63, 64 so as to increase the rotation speed. If the difference in temperature is less than the first temperature, the microcomputer 62 operates to reduce the flow rate of airflow generated in the first and second ventilators 31, 42. Here, the microcomputer 62 operates to reduce the rotation speed of the first and second ventilators 31, 43 every two levels. Simultaneously, the microcomputer 62 calculates the average of the temperature of the second thermal sensors 44. The microcomputer 62 compares the average of the temperature of the second thermal sensors 44 with the temperature of the third thermal sensor 49. If the difference in temperature is equal to a predetermined temperature (15 degrees, for example) or larger, the microcomputer 62 operates to maximize the rotation speed of the first and second ventilators 31, 43. This results in the maximum amount of the supplied air into the ventilation duct 79. The flow rate of the airflow of the first ventilating unit 29 is set equal to that of the second ventilating unit 42. The first ventilators 31 may have a uniform flow rate of the airflow in the first ventilating unit 29. Likewise, the second ventilators 43 may have a uniform flow rate of the airflow in the second ventilating unit 42. The individual ventilators 31, 43 may receive electric power of an equal voltage value. It should be noted that the flow rate of the first ventilating unit 29 may be different from that of the second ventilating unit 42. Different flow rates may be set for the individual ventilators 31, 43. In any case, generation of swirl is preferably avoided in the storage space 32. The generation of swirl leads to an increased noise.

Now, assume that "balance" is established between the required amount of air into the cooling fans 81 and the amount of the air supplied in response to the operation of the first ventilating unit 29 and the second ventilating unit 42. In this case, the first thermal sensors 38 are simultaneously exposed to both the air in the front space 77 and the air in the ventilation duct 79. The front space 77 is filled with the air of a temperature identical to that of the external air. The ventilation duct 79 is filled with the air heated with the generated heat of the server computers 75. The temperature of the first thermal sensors 38 thus slightly rises from the temperature of the external air. The difference in temperature between the first thermal sensors 38 and the third thermal sensor 49 becomes the first temperature or larger, but smaller than the second temperature. The current rotation speed of the first and second ventilators 31, 43 is thus maintained. The cooling fans 81 are allowed to receive a sufficient amount of air without redundancy or shortage. Airflow of a sufficient flow rate passes through the individual server computer 75. Here, the amount of the air supplied in response to the operation of the first ventilating unit 29 and the second ventilating unit 42 may be set slightly smaller than the required amount of the air into the cooling fans 81. In this case, a slight amount of air leaks into the front space 77 from the ventilation duct 79 through the apertures 37. This results in a rise in the temperature of the first temperature sensors 38. However, since only a small amount of air leaks through the apertures 37, the server computers 75 are allowed to receive air of a temperature almost equal to that of the external air.

Figure 12:
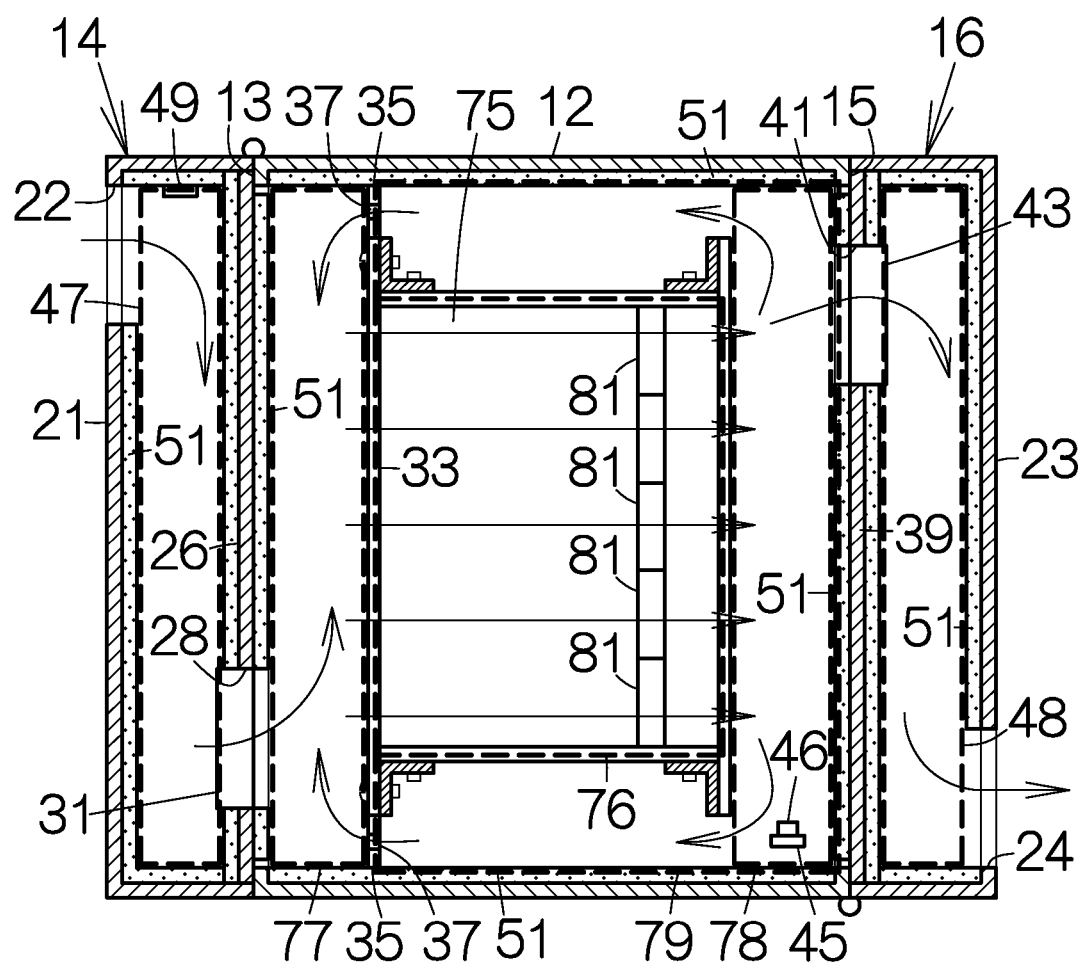
FIG. 12 is a sectional view schematically illustrating airflow generated in the storage box during operation.

Next, assume that the amount of the air supplied in response to the operation of the first ventilating unit 29 and the second ventilating unit 42 is insufficient for the required amount of air into the cooling fans 81. In this case, air circulates within the box-shaped enclosure 12. Specifically, as depicted in FIG. 12, air is introduced into the front space 77 from the ventilation duct 79 through the apertures 37. The air heated with the generated heat of the server computers 75 passes through the apertures 37. This results in a rise in the temperature of the first thermal sensors 38. The difference in temperature between the first thermal sensors 38 and the third thermal sensor 49 becomes the second temperature or larger. The rotation speed of the first and second ventilators 31, 43 is thus increased. The cooling fans 81 are allowed to receive a sufficient amount of air without redundancy or shortage. Airflow of a sufficient flow rate passes through the individual server computer 75. The server computers 75 are reliably cooled.

Figure 13:
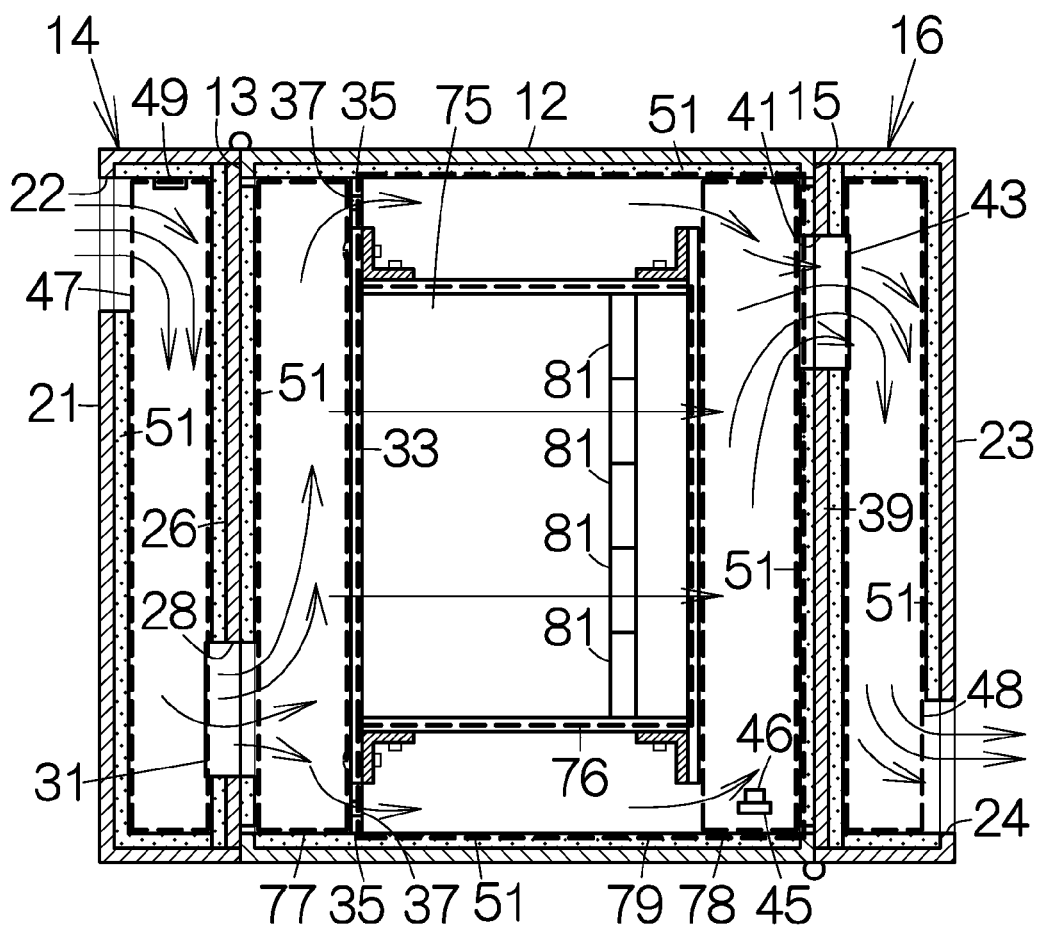
FIG. 13 is a sectional view schematically illustrating airflow generated in the storage box during operation.

Assume that the amount of the air supplied in response to the operation of the first ventilating unit 29 and the second ventilating unit 42 is excessive for the required amount of air into the cooling fans 81. In this case, the air overflows out of the front space 77. Specifically, as depicted in FIG. 13, the air is thus introduced into the ventilation duct 79 from the front space 77 through the apertures 37. The external air passes through the apertures 37. This results in avoidance of a rise in the temperature of the first thermal sensors 38. The difference in temperature is eliminated between the first thermal sensors 38 and the third thermal sensor 49. The difference in temperature becomes smaller than the first temperature. The rotation speed of the first and second ventilators 31, 43 is thus reduced. This results in stoppage of the supply of the airflow at an excessive flow rate to the cooling fans 81. Excessive power consumption is avoided at the first and second ventilating units 29, 42.

The operation of the cooling fan 81 is controlled in response to the temperature inside the enclosure of the server computer 75. The required amount of air into the cooling fan 81 depends on the temperature inside the enclosure. In addition, an arbitrary number of the server computers 75 can be contained in the box-shaped enclosure 12. The amount of air to be supplied to all the cooling fans 81 depends on the number of the mounted server computers 75. The aforementioned first and second ventilating units 29, 42 enable the supply of the required amount of air without redundancy or shortage. The individual server computer 75 is thus reliably cooled. The supply of an excessive amount of air is avoided. Unnecessary power consumption is avoided.

The external air is introduced into the first auxiliary space 47 through the first ventilation opening 22. The air inside the first auxiliary space 47 is supplied to the front space 77 through the first through opening 28. In this manner, the server computers 75 are allowed to always enjoy receiving the fresh external air. The air is discharged from the server computers 75 into the rear space 78. The second ventilating unit 42 serves to supply the discharged air to the second auxiliary space 48. The air is discharged through the second ventilation opening 24. The air of a high temperature is in this manner discharged outside. The first and second ventilating units 29, 42 allow adequate ventilation inside the storage space 32. An excessive increase in temperature is thus reliably avoided in the individual server computer 75. The individual server computer 75 can effectively be cooled. Moreover, the first through opening 28 and the second through opening 41 is a window opening elongated in the direction of gravity. Since the server computers 75 are arranged in the direction of gravity in the rack 33, the individual server computer 75 is allowed to equally enjoy the external air introduced through the first and second through openings 28, 41. The individual server computer 75 can reliably be cooled.

The microcomputer 62 is configured to monitor the first door switch 66 and the second door switch 67 during the control on the operation of the first and second ventilating units 29, 42. When the microcomputer 62 receives a first detection signal from the first door switch 66, the microcomputer 62 outputs a control signal to the first driver circuit 63 to stop the operation of the first ventilating unit 29. The operation of the first ventilating unit 29 is in this manner stopped when the first door 14 is opened. When the microcomputer 62 receives a second detection signal from the second door switch 67, the microcomputer 62 outputs a control signal to the second driver circuit 64 to stop the operation of the second ventilating unit 42. The operation of the second ventilating unit 42 is in this manner stopped when the second door 16 is opened. Alternatively, the microcomputer 62 may output a control signal to stop the operation of the first and second ventilating units 29, 42 in response to the reception of one of the first and second detection signals.

The first door 14 and the second door 16 are removably coupled to the box-shaped enclosure 12 in the storage box 11. The first door 14 and the second door 16 are removed in a facilitated manner. The maintenance of the server computers 75 can be realized within the box-shaped enclosure 12 in a facilitated manner. The first door 14, namely the first auxiliary box-shaped enclosure 21 and the first deadening wall member 26, as well as the second door 16, namely the second auxiliary box-shaped enclosure 23 and the second deadening wall member 39, can be replaced in a facilitated manner.

The second ventilating unit 42 includes a ventilator set identical to a ventilator set incorporated in the first ventilating unit 29. The opening area of the second through opening 41 is thus set equal to the opening area of the first through opening 28. This results in minimization of the opening areas in the first and second deadening wall members 26, 39. In addition, the performance of the second ventilating unit 42 is set equal to the performance of the first ventilating unit 29. Slack of airflow can be avoided in the storage space 32. No swirl is generated in the storage space 32.

It should be noted that either one of the first ventilating unit 29 and the second ventilating unit 42 may be provided in the storage box 11 in the case where the mounted servers computer or computers 75 only requires a small amount of air. Even in such a case, the aforementioned phenomena occur.

Specifically, in the case where "balance" is established between the required amount of air into the cooling fans 81 and the amount of the air supplied in response to the operation of the first ventilating unit 29 or the second ventilating unit 41, the temperature of the first thermal sensors 38 slightly rises from the temperature of the external air. The difference in temperature between the first thermal sensors 38 and the third thermal sensor 49 becomes the first temperature or larger, but smaller than the second temperature. The current rotation speed of the first ventilators 31 or the second ventilators 43 is thus maintained. The cooling fans 81 are allowed to receive a sufficient amount of air without redundancy or shortage. Airflow of a sufficient flow rate passes through the individual server computer 75.

Next, assume that the amount of air supplied in response to the operation of the first ventilating unit 29 or the second ventilating unit 41 is insufficient for the required amount of air into the cooling fans 81. In this case, airflow circulates within the box-shaped enclosure 12. Specifically, air is introduced into the front space 77 from the ventilation dud 79 through the apertures 37. The air heated with the generated heat of the server computers 75 passes through the apertures 37. This results in a rise in the temperature of the first thermal sensors 38. The difference in temperature between the first thermal sensors 38 and the third thermal sensor 49 becomes the second temperature or larger. The rotation speed of the first ventilators 31 or the second ventilators 43 is thus increased. The cooling fans 81 are allowed to receive a sufficient amount of air without redundancy or shortage. Air flow of a sufficient flow rate passes through the individual server computer 75. The server computers 75 are reliably cooled.

Assume that the amount of the air supplied in response to the operation of the first ventilating unit 29 or the second ventilating unit 41 is excessive for the required amount of air into the cooling fans 81. In this case, the air is introduced into the ventilation duct 79 from the front space 77 through the apertures 37. The external air passes through the apertures 37. This results in avoidance of a rise in the temperature of the first thermal sensors 38. The difference in temperature is eliminated between the first thermal sensors 38 and the third thermal sensor 49. The difference in temperature becomes smaller than the first temperature. The rotation speed of the first ventilators 31 or the second ventilators 43 is thus reduced. This results in stoppage of the supply of the airflow at an excessive flow rate to the cooling fans 81. Excessive power consumption is avoided at the first ventilating unit 29 or the second ventilating unit 42.

The first and second thermal sensors 38, 44 are configured to detect the temperature of the air inside the storage space 32. The microcomputer 62 is configured to control the operation of the first and second ventilating units 29, 42 based on the detected temperature of the air. The flow rate of the first and second ventilating units 29, 42 is determined depending on the detected temperature of the air. The external air of an appropriate amount can thus always be introduced into the storage space 32. The server computers 75 are efficiently cooled.

The first through opening 28 extends along the edge defined between first deadening wall member 26 and the second outer wall member 21b, for example. The first thermal sensors 38 are arranged along the edge defined between the first deadening wall member 26 and the third outer wall member 21c. The external air from the first through opening 28 hardly reaches the edge between the first deadening wall member 26 and the third outer wall member 21c. The temperature thus tends to rise at a position near the edge between the first deadening wall member 26 and the third outer wall member 21c. As long as the temperature is detected at such a position, it is possible to reliably prevent the server computers 75 from an excessive rise in temperature. This advantage is also available for the combination of the second through opening 41 and the second thermal sensors 44.

The microcomputer 62 may exclude the maximum value and the minimum value of the detected temperature in calculating the average of the temperature of the first thermal sensors 38. In general, a malfunctioning first thermal sensor 38 is expected to indicate a temperature significantly higher or lower than the average value. Accordingly, exclusion of the maximum value and the minimum value of the temperature leads to avoidance of the influence of the malfunction of the first thermal sensors 38 to the utmost.

Figure 14:
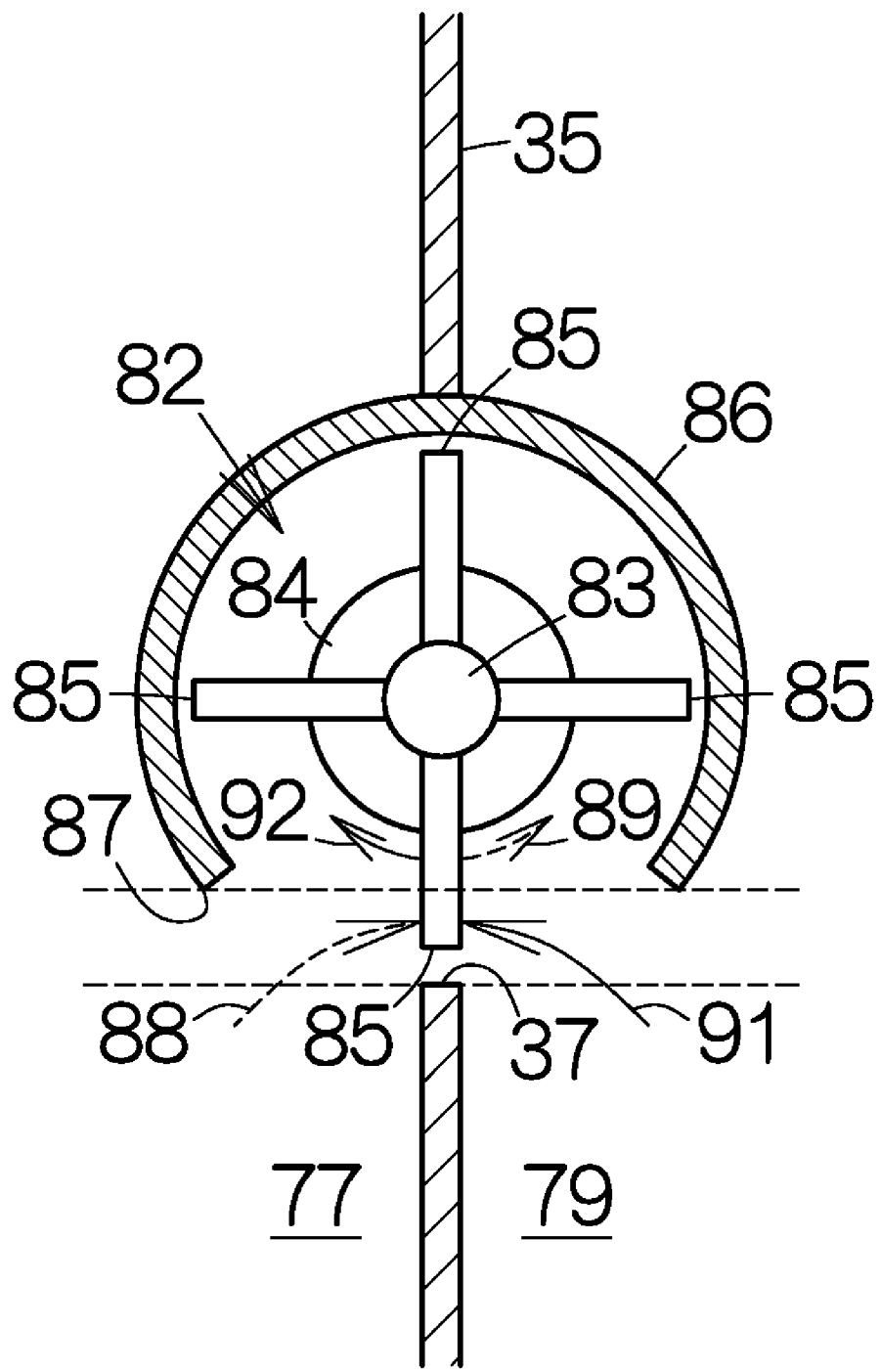
FIG. 14 is an enlarged front view schematically illustrating an anemoscope according to an example.

An anemoscope may be attached to the aperture 37 in place of the aforementioned first thermal sensor 38. As depicted in FIG. 14, for example, the anemoscope 82 includes a rotation shaft 83 extending in the in-plane direction of the partition board 35. The rotation shaft 83 is connected to an encoder 84. The encoder 84 outputs different voltage signals depending on the direction of the rotation of the rotation shaft 83. Blades 85 are attached to the rotation shaft 83. The blades 85 extend in parallel with the rotation shaft 83. Here, the blades 85 are arranged at intervals of the central angle of 90 degrees, for example. The blades 85 are placed within a cylindrical windbreak 86. The cylindrical windbreak 86 serves to define a ventilation opening 87 in combination with the edge of the aperture 37. In the case where air passes through the ventilation opening 87 from the front space 77 toward the ventilation duct 79, for example, the blades 85 receive airflow 88. The rotation shaft 83 is driven to rotate in the anticlockwise direction, namely a normal direction 89. On the contrary, in the case where air passes through the ventilation opening 87 from the ventilation dud 79 toward the front space 77, the blades 85 receives airflow 91. The rotation shaft 83 is driven to rotate in the clockwise direction, namely a reverse direction 92. In this manner, it is possible to specify the direction of the airflow passing through the aperture 37. In this case, the third thermal sensor 49 may be omitted. An anemoscope of any type other than the described one may be employed as the anemoscope 82.

Figure 15:
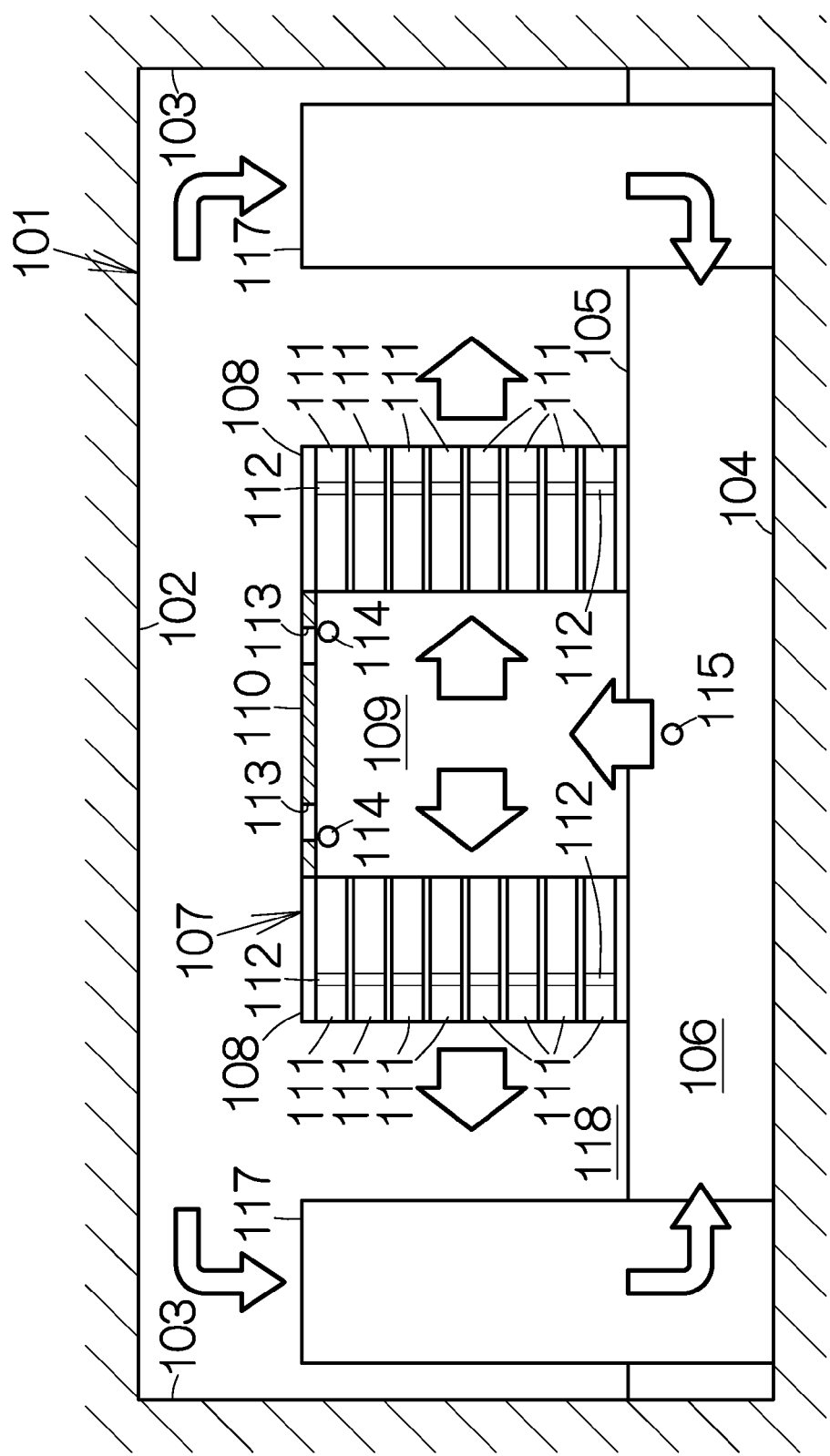
FIG. 15 is a schematic view schematically illustrating a server room as a storage unit according to a second embodiment of the present invention.

FIG. 15 schematically illustrates server room 101 as a storage unit according to a second embodiment of the present invention. The server room 101 includes a ceiling wall 102, side walls 103 and a bottom wall 104. The ceiling wall 102, the side walls 103 and the bottom wall 104 in combination form a closed space. Specifically, the ceiling wall 102, the side walls 103 and the bottom wall 104 in combination form a box-shaped enclosure. A floor 105 is placed between the ceiling wall 102 and the bottom wall 104. The floor 105 extends within a horizontal plane. A bottom space 106 is defined between the floor 105 and the bottom wall 104. A so-called structure corresponds to the enclosure of the storage unit.

A rack 107 is set on the floor 105 of the server room 101. The rack 107 defines a pair of rack spaces 108, for example. The front surfaces of the rack spaces 108 are opposed to each other, for example. An intake space 109 is defined between the rack spaces 108. The intake space 109 is closed with a partition panel 110 and the floor 105. The intake surface of the intake space 109 opens at the floor 105. The intake space 109 is connected to the bottom space 106 through the intake surface. The intake space 109 and the rack spaces 108 in combination provide a ventilation duct. The intake surface of the intake space 109 corresponds to the intake surface of the ventilation duct. The rear surfaces of the rack spaces 108 provide the discharge surfaces of the ventilation duct. A server computer or computers 111 of a rack mount type can be mounted on the individual rack space 108. An airflow generator, namely a cooling fan 112, is incorporated in the individual server computer 111 so as to generate airflow from the front surfaces toward the rear surfaces of the rack spaces 108.

Apertures 113 are formed in the partition panel 110. The apertures 113 allow intake and discharge of airflow for the ventilation duct. A first thermal sensor 114 is placed at the individual aperture 113. The first thermal sensor 114 is configured to detect the temperature of the airflow passing through the corresponding aperture 113. Likewise, a second thermal sensor 115 is placed in the bottom space 106. The second thermal sensor 115 is configured to detect the temperature of the air inside the bottom space 106.

Air conditioners 117 are placed in the server room 101. The air conditioners 117 suck a heated air from an interior space 118 above the floor 105. The air conditioners 117 discharge a cooling air into the bottom space 106. A circulating loop of airflow is thus established based on the air conditioners 117, the bottom space 106, the intake space 109, the rack spaces 108 and the interior space 118. A controller circuit is incorporated in the air conditioner 117. The controller circuit is configured to control the flow rate of the air conditioner 117 in accordance with the detected temperature of the first and second thermal sensors 114, 115.

During the operation of the individual server computer 111, the cooling fan 112 operates in the individual server computer 111 in accordance with the inner temperature of the server computer 111. The cooling fan 112 generates a horizontal airflow within the enclosure of the server computer 111 from the intake space 109 toward the interior space 118. Airflow is generated from the intake surface toward the discharge surface.

The air conditioners 117 suck the heated air from the interior space 118. Cooling air is discharged from the air conditioners 117 toward the bottom space 106. Now, assume that "balance" is established between the flow rate of the cooling air discharged from the air conditioners 117 and the required amount of air into the cooling fans 112. In this case, the first thermal sensors 114 are simultaneously exposed to the air in the intake space 109 and the air in the interior space 118. The intake space 109 is filled with air of a temperature identical to that of the air in the bottom space 106, while the interior space 118 is filled with the air heated with the generated heat of the server computers 111. The temperature of the first thermal sensors 114 thus slightly rises from the external air. The difference in temperature between the first thermal sensors 114 and the second thermal sensor 115 becomes the first temperature or larger, but smaller than the second temperature. Accordingly, the cooling performance of the air conditioners 117 is maintained. The cooling fans 81 are allowed to receive a sufficient amount of air without redundancy or shortage. Airflow of a sufficient flow rate passes through the individual server computer 111.

Figure 16:
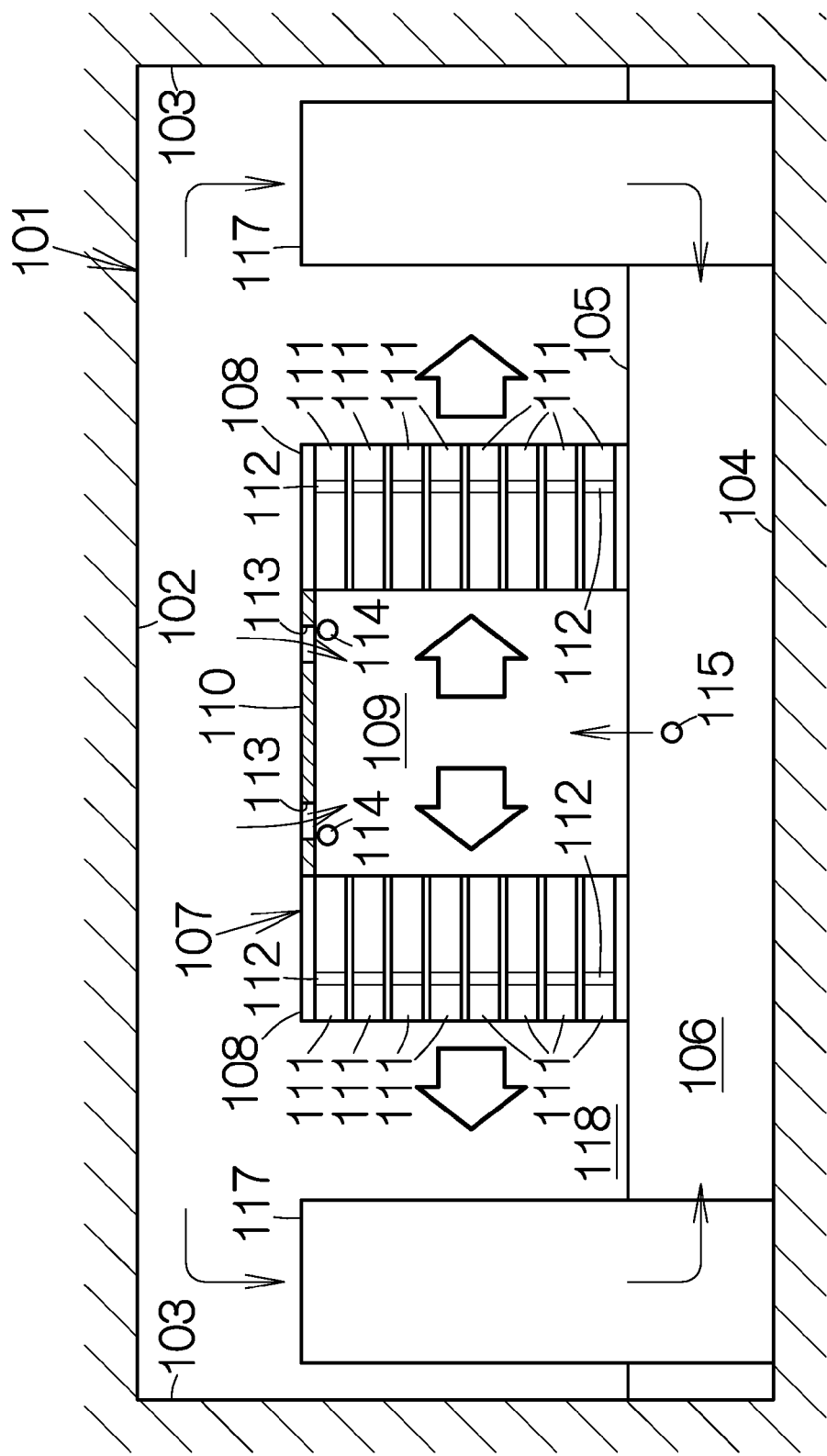
FIG. 16 is a schematic view schematically illustrating airflow generated in the server room during the operation of an information processing apparatus.

Next, assume that the amount of the cooling air discharged from the air conditioners 117 is insufficient for the required amount of air into the cooling fans 112. In this case, airflow circulates in the space above the floor 105. Specifically, as depicted in FIG. 16, air is introduced into the intake space 109 in the ventilation duct from the interior space 118 through the apertures 113. The heated air passes through the apertures 113. This results in a rise in the temperature of the first temperature sensors 114. The difference in temperature between the first thermal sensors 114 and the second thermal sensor 115 becomes the second temperature or larger. Accordingly, the cooling performance of the air conditioner 117 is enhanced. The cooling fans 81 are allowed to receive a sufficient amount of cooling air without redundancy or shortage. Airflow of a sufficient flow rate passes through the individual server computer 111. The individual server computer 111 is reliably cooled.

Figure 17:
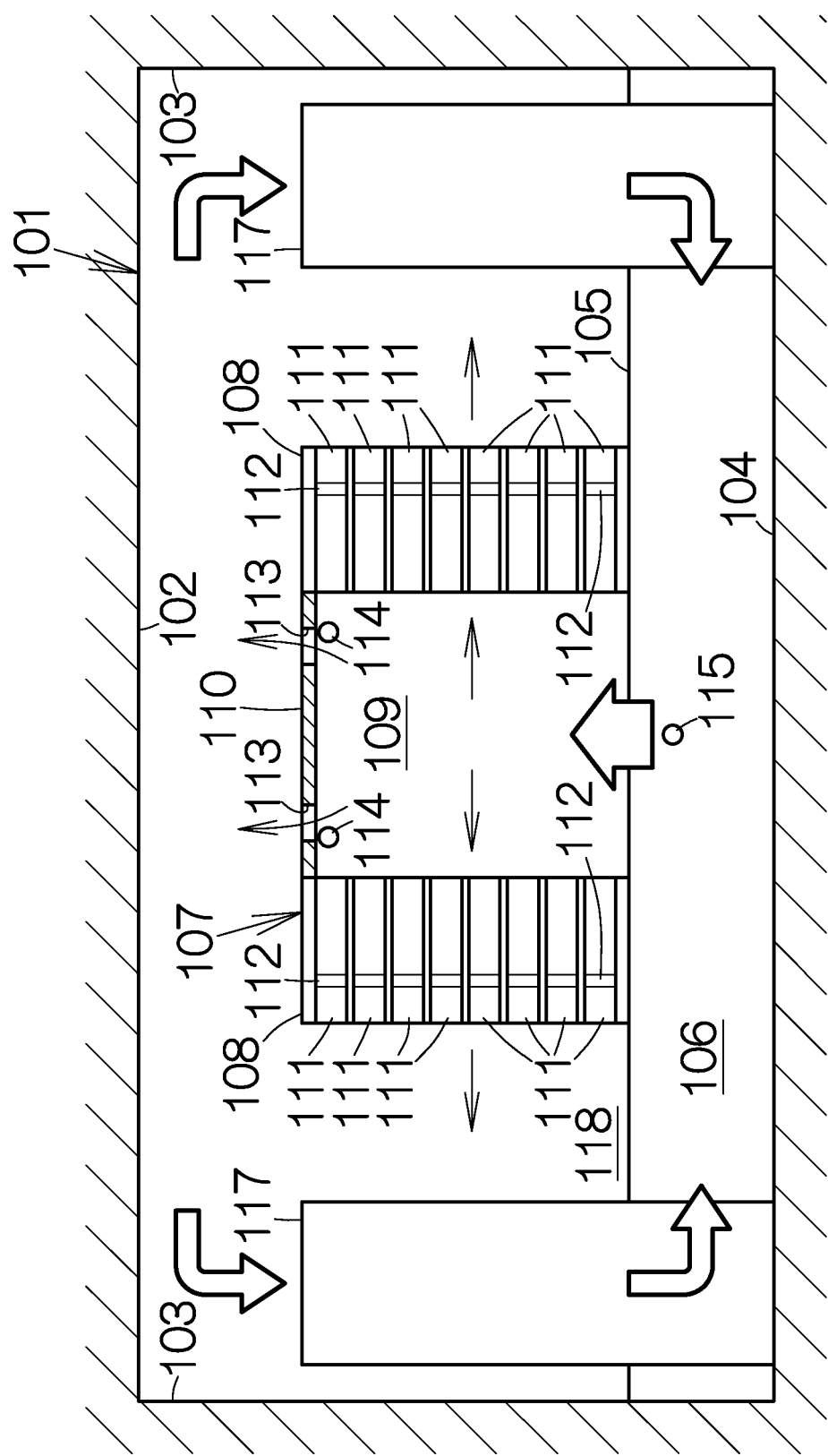
FIG. 17 is a schematic view schematically illustrating airflow generated in the server room during the operation of an information processing apparatus.

Assume that the amount of the cooling air discharged from the air conditioners 117 is excessive for the required amount of air into the cooling fans 112. In this case, the air overflows the intake space 109. Specifically, as depicted in FIG. 17, air overflows into the interior space 118 from the intake space 109 of the ventilation duct through the apertures 113. The cooling air passes through the apertures 113. This results in avoidance of a rise in the temperature of the first thermal sensors 114. The difference in temperature is eliminated between the first thermal sensors 114 and the second thermal sensor 115. The difference in temperature becomes smaller than the first temperature. Accordingly, the cooling performance of the air conditioners 117 is reduced. This results in stoppage of the supply of the cooling air at an excessive flow rate to the cooling fans 112. Excessive power consumption is avoided at the air conditioners 117.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A storage unit comprising:
   an enclosure including a storage section having an inlet surface and an outlet surface, the storage section being configured to contain an information processing apparatus including an airflow generator placed within the information processing apparatus, the enclosure defining a space outside the storage section;
   a partition placed in the space outside the storage section, the partition configured to partition the space outside the storage section into an intake section and a discharge section;
   the intake section connected to the inlet surface of the storage section, the intake section allowing flow of a cooling medium to be sucked into the storage section through the inlet surface for cooling the information processing apparatus;
   the discharge section connected to the outlet surface of the storage section, the discharge section receiving the cooling medium discharged from the outlet surface;
   a cooling medium flow generating section located outside the storage section, the cooling medium flow generating section configured to control intake of the cooling medium into the intake section and discharge of the cooling medium from the discharge section;
   an aperture formed in the partition;
   a detector section configured to detect an inflow of the cooling medium, discharged from the discharge section, through the aperture; and
   a controller configured to control the cooling medium flow generating section in accordance with a result of the detection of the detector section.

2. The storage unit according to claim 1, wherein the detector section detects temperature in the aperture, and the controller controls operation of the cooling medium flow generating section in accordance with the temperature in the aperture and temperature of the intake section.

3. The storage unit according to claim 2, wherein the controller controls the cooling medium flow generating section such that the intake and discharge of the cooling medium are accelerated when the temperature in the aperture exceeds the temperature of the intake section by a predetermined amount.

4. The storage unit according to claim 1, wherein the detector section detects direction of a flow of the cooling medium at the aperture.

5. The storage unit according to claim 1, wherein the enclosure of the storage unit is a structure, the storage section is set on a floor in a room.

6. An information processing apparatus comprising:
an enclosure including a storage section having an inlet surface and an outlet surface, the enclosure defining a space outside the storage section;
an information processing unit contained in the storage section to execute information processing, the information processing unit including an airflow generator placed within the information processing unit;
a partition placed in the space outside the storage section, the partition configured to partition the space outside the storage section into an intake section and a discharge section;
the intake section connected to the inlet surface of the storage section, the intake section allowing flow of a cooling medium to be sucked into the storage section through the inlet surface for cooling the information processing unit;
the discharge section connected to the outlet surface of the storage section, the discharge section receiving the cooling medium discharged from the storage section through the outlet surface;
a cooling medium flow generating section located outside the storage section, the cooling medium flow generating section configured to control intake of the cooling medium into the intake section and discharge of the cooling medium from the discharge section;
an aperture formed in the partition;
a detector section configured to detect an inflow of the cooling medium, discharged from the discharge section, through the aperture;
a controller configured to control the cooling medium flow generating section in accordance with a result of the detection of the detector section; and
a power supply section configured to supply electric power to the information processing unit, the cooling medium flow generating section, the detector section and the controller.

7. The information processing apparatus according to claim 6, wherein the detector section detects temperature in the aperture, the controller controls operation of the cooling medium flow generating section in accordance with the temperature in the aperture and temperature of the intake section.

8. The information processing apparatus according to claim 7, wherein the controller controls the cooling medium flow generating section such that the intake and discharge of the cooling medium are accelerated when the temperature in the aperture exceeds the temperature of the intake section by a predetermined amount.

9. The information processing apparatus according to claim 6, wherein the detector section detects direction of a flow of the cooling medium at the aperture.

10. A method of cooling an information processing apparatus, the information processing apparatus including:
an enclosure including a storage section having an inlet surface and an outlet surface, the enclosure defining a space outside the storage section;
an information processing unit contained in the storage section to execute information processing, the information processing unit including an airflow generator placed within the information processing unit;
a partition placed in the space outside the storage section, the partition configured to partition the space outside the storage section into an intake section and a discharge section;
the intake section connected to the inlet surface of the storage section, the intake section allowing flow of a cooling medium to be sucked into the storage section through the inlet surface for cooling the information processing unit;
the discharge section connected to the outlet surface of the storage section, the discharge section receiving the cooling medium discharged from the storage section through the outlet surface; and
a cooling medium flow generating section located outside the storage section, the cooling medium flow generating section configured to control intake of the cooling medium into the intake section and discharge of the cooling medium from the discharge section,
the method comprising:
detecting an inflow of the cooling medium, discharged from the discharge section, through an aperture formed in the partition, by using a detector apparatus; and
controlling operation of the cooling medium flow generating section in accordance with a detection of the inflow.

* * * * *